US012760415B2

(12) United States Patent
Collins et al.

(10) Patent No.: US 12,760,415 B2
(45) Date of Patent: Oct. 13, 2026

(54) DEPOSITION OF METAL FILMS

(71) Applicant: Lam Research Corporation, Fremont, CA (US)

(72) Inventors: Joshua Collins, Sebastopol, CA (US); Griffin John Kennedy, Livermore, CA (US); Hanna Bamnolker, Cupertino, CA (US); Patrick A. Van Cleemput, Duvall, WA (US); Seshasayee Varadarajan, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/626,278

(22) Filed: Apr. 3, 2024

(65) Prior Publication Data

US 2024/0271281 A1 Aug. 15, 2024

Related U.S. Application Data

(63) Continuation of application No. 17/310,293, filed as application No. PCT/US2020/015241 on Jan. 27, 2020, now Pat. No. 11,970,776.

(Continued)

(51) Int. Cl.
*C23C 16/30* (2006.01)
*C23C 16/06* (2006.01)
(Continued)

(52) U.S. Cl.
CPC ........ *C23C 16/45553* (2013.01); *C23C 16/06* (2013.01); *C23C 16/08* (2013.01);
(Continued)

(58) Field of Classification Search
None
See application file for complete search history.

(56) References Cited

U.S. PATENT DOCUMENTS

| | | | |
|---|---|---|---|
| 1,012,671 | A | 12/1911 | Long |
| 4,766,006 | A | 8/1988 | Gaczi |

(Continued)

FOREIGN PATENT DOCUMENTS

| | | | |
|---|---|---|---|
| CN | 1332267 | A | 1/2002 |
| CN | 1675402 | A | 9/2005 |

(Continued)

OTHER PUBLICATIONS

CAS Registry No. 500120-09-2, CAS SciFinder, 2025, 2 Pages.

(Continued)

*Primary Examiner* — William Henry Anderson
(74) *Attorney, Agent, or Firm* — Weaver Austin Villeneuve & Sampson LLP

(57) ABSTRACT

Provided herein are low resistance metallization stack structures for logic and memory applications and related methods of fabrication. In some embodiments, thin metal oxynitride or metal nitride nucleation layers are deposited followed by deposition of a pure metal conductor. The nucleation layer is amorphous, which templates large pure metal film grain growth and reduced resistivity. Further, certain embodiments of the methods described below convert most or all of the metal oxynitride nucleation layer to a pure metal layer, further lowering the resistivity.

14 Claims, 8 Drawing Sheets

Related U.S. Application Data

(60) Provisional application No. 62/797,860, filed on Jan. 28, 2019.

(51) Int. Cl.

| | |
|---|---|
| ***C23C 16/08*** | (2006.01) |
| ***C23C 16/34*** | (2006.01) |
| ***C23C 16/455*** | (2006.01) |
| ***C23C 16/52*** | (2006.01) |
| ***C23C 16/56*** | (2006.01) |
| ***H10P 14/40*** | (2026.01) |
| *H10B 12/00* | (2023.01) |
| *H10B 41/20* | (2023.01) |
| *H10P 14/60* | (2026.01) |
| *H10P 14/692* | (2026.01) |

(52) U.S. Cl.

CPC ............ *C23C 16/308* (2013.01); *C23C 16/34* (2013.01); *C23C 16/45525* (2013.01); *C23C 16/45529* (2013.01); *C23C 16/45534* (2013.01); *C23C 16/52* (2013.01); *C23C 16/56* (2013.01); *H10P 14/418* (2026.01); *H10B 12/34* (2023.02); *H10B 41/20* (2023.02); *H10P 14/6339* (2026.01); *H10P 14/6939* (2026.01)

(56) References Cited

U.S. PATENT DOCUMENTS

| | | | |
|---|---|---|---|
| 5,223,455 A | 6/1993 | Itoh et al. | |
| 5,502,005 A | 3/1996 | Mikagi | |
| 5,612,254 A | 3/1997 | Mu et al. | |
| 5,643,394 A | 7/1997 | Maydan et al. | |
| 5,681,613 A | 10/1997 | Hansen | |
| 5,863,836 A | 1/1999 | Jones | |
| 6,103,609 A * | 8/2000 | Lee | H01L 21/28061 257/E21.198 |
| 6,271,084 B1 | 8/2001 | Tu et al. | |
| 6,274,484 B1 | 8/2001 | Tsai et al. | |
| 6,284,653 B1 | 9/2001 | Tseng | |
| 6,306,216 B1 | 10/2001 | Kim et al. | |
| 6,359,160 B1 | 3/2002 | Sun et al. | |
| 6,635,965 B1 | 10/2003 | Lee et al. | |
| 6,794,287 B2 | 9/2004 | Saanila et al. | |
| 6,844,258 B1 | 1/2005 | Fair et al. | |
| 6,905,543 B1 | 6/2005 | Fair et al. | |
| 6,958,174 B1 | 10/2005 | Klaus et al. | |
| 6,979,625 B1 | 12/2005 | Woo et al. | |
| 7,005,372 B2 | 2/2006 | Levy et al. | |
| 7,141,494 B2 | 11/2006 | Lee et al. | |
| 7,250,367 B2 | 7/2007 | Vaartstra et al. | |
| 7,262,125 B2 | 8/2007 | Wongsenakhum et al. | |
| 7,560,581 B2 | 7/2009 | Gordon et al. | |
| 7,589,017 B2 | 9/2009 | Chan et al. | |
| 7,691,749 B2 | 4/2010 | Levy et al. | |
| 7,772,114 B2 | 8/2010 | Chan et al. | |
| 7,955,972 B2 | 6/2011 | Chan et al. | |
| 7,993,457 B1 | 8/2011 | Krotov et al. | |
| 8,053,365 B2 | 11/2011 | Humayun et al. | |
| 8,058,170 B2 | 11/2011 | Chandrashekar et al. | |
| 8,089,128 B2 | 1/2012 | Ramaswamy et al. | |
| 8,101,521 B1 | 1/2012 | Gao et al. | |
| 8,119,527 B1 | 2/2012 | Chadrashekar et al. | |
| 8,278,216 B1 | 10/2012 | Alers et al. | |
| 9,076,646 B2 | 7/2015 | Sims et al. | |
| 9,082,826 B2 | 7/2015 | Chandrashekar et al. | |
| 9,159,571 B2 | 10/2015 | Humayun et al. | |
| 9,175,023 B2 | 11/2015 | Odedra et al. | |
| 9,236,297 B2 | 1/2016 | Chen et al. | |
| 9,269,612 B2 | 2/2016 | Chen et al. | |
| 9,548,266 B2 | 1/2017 | Ajuria et al. | |
| 9,583,385 B2 | 2/2017 | Lee et al. | |
| 9,595,470 B2 | 3/2017 | Bamnolker et al. | |
| 9,613,818 B2 | 4/2017 | Ba et al. | |
| 9,653,353 B2 | 5/2017 | Chandrashekar et al. | |
| 9,659,998 B1 | 5/2017 | Lung | |
| 9,899,372 B1 | 2/2018 | Bi et al. | |
| 9,978,605 B2 | 5/2018 | Bamnolker et al. | |
| 10,014,185 B1 | 7/2018 | Wu et al. | |
| 10,079,144 B2 | 9/2018 | Kim et al. | |
| 10,094,021 B2 | 10/2018 | Lansalot-Matras et al. | |
| 10,096,475 B1 | 10/2018 | Shaikh | |
| 10,121,671 B2 | 11/2018 | Fu et al. | |
| 10,283,404 B2 | 5/2019 | Na et al. | |
| 10,395,984 B2 | 8/2019 | Backes et al. | |
| 10,505,111 B1 | 12/2019 | Ok et al. | |
| 10,510,590 B2 | 12/2019 | Thombare et al. | |
| 10,510,951 B1 | 12/2019 | Yu et al. | |
| 10,566,211 B2 | 2/2020 | Chandrashekar et al. | |
| 10,573,522 B2 | 2/2020 | Jandl et al. | |
| 10,622,375 B2 | 4/2020 | Chun et al. | |
| 10,643,826 B2 | 5/2020 | Kim et al. | |
| 10,643,904 B2 | 5/2020 | Xie et al. | |
| 10,731,250 B2 | 8/2020 | Kim et al. | |
| 10,734,238 B2 | 8/2020 | Zhou et al. | |
| 10,763,108 B2 | 9/2020 | Hausmann et al. | |
| 10,777,453 B2 | 9/2020 | Thombare et al. | |
| 10,995,405 B2 | 5/2021 | Dezelah et al. | |
| 11,211,253 B2 | 12/2021 | Zhou et al. | |
| 11,295,980 B2 | 4/2022 | Zope et al. | |
| 11,355,345 B2 | 6/2022 | Jandl et al. | |
| 11,549,175 B2 | 1/2023 | Butail et al. | |
| 11,821,071 B2 | 11/2023 | Blakeney | |
| 11,970,776 B2 | 4/2024 | Collins et al. | |
| 12,074,029 B2 | 8/2024 | Van Cleemput et al. | |
| 12,148,623 B2 | 11/2024 | Van Cleemput et al. | |
| 12,327,762 B2 | 6/2025 | Schloss et al. | |
| 12,334,351 B2 | 6/2025 | Na et al. | |
| 12,351,914 B2 | 7/2025 | Collins et al. | |
| 12,362,188 B2 | 7/2025 | Jandl et al. | |
| 12,553,131 B2 | 2/2026 | Thombare et al. | |
| 12,588,475 B2 | 3/2026 | Bhadauriya et al. | |
| 12,598,925 B2 | 4/2026 | Schloss et al. | |
| 2001/0002326 A1 | 5/2001 | Yang et al. | |
| 2002/0009872 A1 | 1/2002 | Hoshino et al. | |
| 2002/0024140 A1 | 2/2002 | Nakajima et al. | |
| 2002/0045355 A1 | 4/2002 | Chong et al. | |
| 2003/0019428 A1 | 1/2003 | Ku et al. | |
| 2003/0082296 A1 | 5/2003 | Elers et al. | |
| 2003/0194825 A1 | 10/2003 | Law et al. | |
| 2003/0209193 A1 | 11/2003 | Van Wijck | |
| 2004/0018304 A1 | 1/2004 | Chung et al. | |
| 2004/0087143 A1 | 5/2004 | Norman et al. | |
| 2004/0142557 A1 | 7/2004 | Levy et al. | |
| 2004/0202786 A1 | 10/2004 | Wongsenakhum et al. | |
| 2005/0031786 A1 | 2/2005 | Lee et al. | |
| 2005/0186342 A1 | 8/2005 | Sager et al. | |
| 2005/0212139 A1 | 9/2005 | Leinikka et al. | |
| 2005/0277296 A1 | 12/2005 | Adetutu et al. | |
| 2005/0282384 A1 | 12/2005 | Nawafune et al. | |
| 2006/0040052 A1 | 2/2006 | Fang et al. | |
| 2006/0046521 A1 | 3/2006 | Vaartstra et al. | |
| 2006/0102950 A1 | 5/2006 | Takebuchi et al. | |
| 2006/0115590 A1 | 6/2006 | Suzuki et al. | |
| 2006/0128150 A1 | 6/2006 | Gandikota et al. | |
| 2007/0009658 A1 | 1/2007 | Yoo et al. | |
| 2007/0066060 A1 | 3/2007 | Wang | |
| 2007/0069383 A1 | 3/2007 | Suzuki | |
| 2007/0077712 A1 | 4/2007 | Joo et al. | |
| 2007/0190780 A1 | 8/2007 | Chung et al. | |
| 2007/0190782 A1 | 8/2007 | Park | |
| 2007/0215852 A1 | 9/2007 | Lung | |
| 2007/0232015 A1 | 10/2007 | Liu | |
| 2008/0014352 A1 | 1/2008 | Xi et al. | |
| 2008/0061282 A1 | 3/2008 | Sato et al. | |
| 2008/0116437 A1 | 5/2008 | Oh et al. | |
| 2008/0124926 A1 | 5/2008 | Chan et al. | |
| 2008/0170984 A1 | 7/2008 | Tenne et al. | |
| 2008/0191351 A1 | 8/2008 | Ahn et al. | |
| 2008/0197335 A1 | 8/2008 | Yu | |
| 2008/0206987 A1 | 8/2008 | Gelatos et al. | |
| 2008/0227291 A1 | 9/2008 | Lai et al. | |
| 2008/0254623 A1 | 10/2008 | Chan et al. | |

(56) References Cited

U.S. PATENT DOCUMENTS

| | | | |
|---|---|---|---|
| 2008/0268642 | A1 | 10/2008 | Yanagita et al. |
| 2008/0274617 | A1 | 11/2008 | Milligan |
| 2008/0280390 | A1 | 11/2008 | Kim et al. |
| 2008/0303014 | A1 | 12/2008 | Goux et al. |
| 2008/0317972 | A1 | 12/2008 | Hendriks et al. |
| 2009/0004848 | A1 | 1/2009 | Kim et al. |
| 2009/0053893 | A1 | 2/2009 | Khandelwal et al. |
| 2009/0081374 | A1 | 3/2009 | Yang et al. |
| 2009/0149022 | A1 | 6/2009 | Chan et al. |
| 2009/0212280 | A1 | 8/2009 | Werner et al. |
| 2009/0239368 | A1 | 9/2009 | Park et al. |
| 2009/0304914 | A1 | 12/2009 | Nalla et al. |
| 2010/0107927 | A1 | 5/2010 | Stewart et al. |
| 2010/0159694 | A1 | 6/2010 | Chandrashekar et al. |
| 2010/0167527 | A1 | 7/2010 | Wu et al. |
| 2010/0168404 | A1 | 7/2010 | Girolami et al. |
| 2010/0176512 | A1 | 7/2010 | Yang et al. |
| 2010/0207245 | A1 | 8/2010 | Cheng et al. |
| 2010/0213541 | A1 | 8/2010 | Jeon et al. |
| 2010/0227473 | A1 | 9/2010 | Matsuda et al. |
| 2010/0320607 | A1 | 12/2010 | Suzuki |
| 2011/0020546 | A1 | 1/2011 | Hamalainen et al. |
| 2011/0021024 | A1 | 1/2011 | Calvo-Munoz et al. |
| 2011/0146568 | A1 | 6/2011 | Haukka et al. |
| 2011/0151615 | A1 | 6/2011 | Gordon et al. |
| 2011/0155993 | A1 | 6/2011 | Chen |
| 2011/0223763 | A1 | 9/2011 | Chan et al. |
| 2011/0256645 | A1 | 10/2011 | Tam et al. |
| 2011/0256726 | A1 | 10/2011 | Lavoie et al. |
| 2011/0287184 | A1 | 11/2011 | Shenai-Khatkhate et al. |
| 2012/0045589 | A1 | 2/2012 | Ivanov et al. |
| 2012/0119177 | A1 | 5/2012 | Erbetta |
| 2012/0187305 | A1 | 7/2012 | Elam et al. |
| 2012/0231626 | A1 | 9/2012 | Lee et al. |
| 2012/0305872 | A1 | 12/2012 | Yoon |
| 2013/0109172 | A1 | 5/2013 | Collins et al. |
| 2013/0164928 | A1 | 6/2013 | Lim et al. |
| 2013/0189837 | A1 | 7/2013 | Haukka et al. |
| 2013/0196505 | A1 | 8/2013 | Hasegawa et al. |
| 2013/0234148 | A1 | 9/2013 | Werkhoven |
| 2013/0270107 | A1 | 10/2013 | Ewert et al. |
| 2013/0270703 | A1 | 10/2013 | Zierath et al. |
| 2013/0302980 | A1 | 11/2013 | Chandrashekar et al. |
| 2014/0106083 | A1 | 4/2014 | Wu et al. |
| 2014/0119977 | A1 | 5/2014 | Gatineau et al. |
| 2014/0138604 | A1 | 5/2014 | Liu et al. |
| 2014/0147589 | A1 | 5/2014 | Khandelwal et al. |
| 2014/0217590 | A1 | 8/2014 | Nalla et al. |
| 2014/0284801 | A1 | 9/2014 | Kitamura et al. |
| 2014/0370192 | A1 | 12/2014 | Odedra et al. |
| 2015/0024592 | A1 | 1/2015 | Chandrashekar et al. |
| 2015/0170961 | A1 | 6/2015 | Romero et al. |
| 2015/0179461 | A1 | 6/2015 | Bamnolker et al. |
| 2015/0262939 | A1 | 9/2015 | Sakata |
| 2015/0325475 | A1 | 11/2015 | Bamnolker et al. |
| 2015/0348840 | A1 | 12/2015 | Bamnolker et al. |
| 2015/0354064 | A1 | 12/2015 | Kolics et al. |
| 2016/0027614 | A1 | 1/2016 | Manna et al. |
| 2016/0040289 | A1 | 2/2016 | Gatineau et al. |
| 2016/0042940 | A1 | 2/2016 | Nakatani et al. |
| 2016/0056074 | A1 | 2/2016 | Na et al. |
| 2016/0064409 | A1 | 3/2016 | Yaegashi |
| 2016/0077435 | A1 | 3/2016 | Ban et al. |
| 2016/0104624 | A1 | 4/2016 | Fu et al. |
| 2016/0109800 | A1 | 4/2016 | Bae et al. |
| 2016/0118345 | A1 | 4/2016 | Chen et al. |
| 2016/0141419 | A1 | 5/2016 | Baenninger et al. |
| 2016/0148945 | A1 | 5/2016 | Sharangpani et al. |
| 2016/0168699 | A1 | 6/2016 | Fukazawa et al. |
| 2016/0172211 | A1 | 6/2016 | Demos et al. |
| 2016/0181149 | A1 | 6/2016 | Deng |
| 2016/0181272 | A1 | 6/2016 | Rabkin et al. |
| 2016/0225632 | A1 | 8/2016 | Shaikh et al. |
| 2016/0300952 | A1 | 10/2016 | Toriumi et al. |
| 2016/0309596 | A1 | 10/2016 | Shaviv et al. |
| 2016/0343612 | A1 | 11/2016 | Wang et al. |
| 2016/0351401 | A1 | 12/2016 | Ba et al. |
| 2016/0351444 | A1 | 12/2016 | Schloss et al. |
| 2017/0016113 | A1 | 1/2017 | Thompson et al. |
| 2017/0040214 | A1 | 2/2017 | Lai et al. |
| 2017/0062224 | A1 * | 3/2017 | Fu .................... C23C 16/45553 |
| 2017/0062714 | A1 | 3/2017 | Kau |
| 2017/0069527 | A1 | 3/2017 | Haukka et al. |
| 2017/0117155 | A1 * | 4/2017 | Bamnolker ............. H10P 14/43 |
| 2017/0125548 | A1 | 5/2017 | Hung et al. |
| 2017/0170026 | A1 | 6/2017 | Hudson et al. |
| 2017/0178899 | A1 | 6/2017 | Kabansky et al. |
| 2017/0213901 | A1 | 7/2017 | Ho et al. |
| 2017/0229341 | A1 | 8/2017 | Chang et al. |
| 2017/0268107 | A1 | 9/2017 | Lansalot-Matras et al. |
| 2017/0294381 | A1 | 10/2017 | Briggs et al. |
| 2017/0306479 | A1 | 10/2017 | Raisanen et al. |
| 2017/0306490 | A1 | 10/2017 | Chan et al. |
| 2017/0350008 | A1 | 12/2017 | Collins et al. |
| 2017/0358482 | A1 | 12/2017 | Chen et al. |
| 2018/0019165 | A1 | 1/2018 | Baum et al. |
| 2018/0053660 | A1 | 2/2018 | Jandl et al. |
| 2018/0142345 | A1 | 5/2018 | Meng et al. |
| 2018/0151497 | A1 | 5/2018 | Makala et al. |
| 2018/0166276 | A1 | 6/2018 | Nakao et al. |
| 2018/0218902 | A1 | 8/2018 | Venkatasubramania et al. |
| 2018/0240675 | A1 | 8/2018 | Bamnolker et al. |
| 2018/0240676 | A1 * | 8/2018 | Chan ..................... H10P 14/432 |
| 2018/0247832 | A1 | 8/2018 | Fischer et al. |
| 2018/0261503 | A1 | 9/2018 | Meng et al. |
| 2018/0286668 | A1 | 10/2018 | Baum et al. |
| 2018/0294187 | A1 | 10/2018 | Thombare et al. |
| 2018/0312966 | A1 | 11/2018 | Chan et al. |
| 2018/0342390 | A1 | 11/2018 | Xiao et al. |
| 2018/0347041 | A1 | 12/2018 | Kim et al. |
| 2018/0355484 | A1 | 12/2018 | Lansalot-Matras et al. |
| 2019/0003050 | A1 | 1/2019 | Dezelah et al. |
| 2019/0006226 | A1 | 1/2019 | Khare et al. |
| 2019/0019725 | A1 | 1/2019 | Chandrashekar et al. |
| 2019/0027573 | A1 | 1/2019 | Zhu et al. |
| 2019/0035735 | A1 | 1/2019 | Fitzsimmons et al. |
| 2019/0067003 | A1 | 2/2019 | Zope et al. |
| 2019/0067014 | A1 * | 2/2019 | Shrestha ................. C23C 16/14 |
| 2019/0067094 | A1 | 2/2019 | Zope et al. |
| 2019/0067095 | A1 | 2/2019 | Zhu et al. |
| 2019/0088474 | A1 | 3/2019 | Macdonald et al. |
| 2019/0088555 | A1 | 3/2019 | Xie et al. |
| 2019/0157102 | A1 | 5/2019 | Jian et al. |
| 2019/0157141 | A1 | 5/2019 | Liao et al. |
| 2019/0161853 | A1 | 5/2019 | Aoyama et al. |
| 2019/0177838 | A1 | 6/2019 | Cadot et al. |
| 2019/0189456 | A1 | 6/2019 | Mullick et al. |
| 2019/0189688 | A1 | 6/2019 | Lille |
| 2019/0226086 | A1 * | 7/2019 | Wright, Jr. .......... C23C 16/0272 |
| 2019/0256467 | A1 | 8/2019 | Anthis et al. |
| 2019/0273019 | A1 | 9/2019 | Mullick et al. |
| 2019/0282384 | A1 | 9/2019 | Phillips |
| 2019/0368039 | A1 * | 12/2019 | Arteaga .................. C07F 11/00 |
| 2019/0371662 | A1 | 12/2019 | Chen et al. |
| 2020/0006073 | A1 | 1/2020 | Smith et al. |
| 2020/0010954 | A1 | 1/2020 | Bhuyan et al. |
| 2020/0071816 | A1 | 3/2020 | Lei et al. |
| 2020/0075403 | A1 | 3/2020 | Thombare et al. |
| 2020/0105515 | A1 | 4/2020 | Maes et al. |
| 2020/0111675 | A1 | 4/2020 | Takatsuki et al. |
| 2020/0115798 | A1 | 4/2020 | Wright, Jr. et al. |
| 2020/0131628 | A1 | 4/2020 | Baum et al. |
| 2020/0144066 | A1 | 5/2020 | Jandl et al. |
| 2020/0152870 | A1 | 5/2020 | Lin et al. |
| 2020/0176574 | A1 | 6/2020 | Huang et al. |
| 2020/0194670 | A1 | 6/2020 | Allegra |
| 2020/0199743 | A1 | 6/2020 | Wright, Jr. et al. |
| 2020/0219933 | A1 | 7/2020 | Cheng |
| 2020/0227275 | A1 | 7/2020 | Mullick et al. |
| 2020/0242209 | A1 | 7/2020 | Bowes et al. |
| 2020/0283894 | A1 | 9/2020 | Lehn et al. |
| 2020/0332416 | A1 | 10/2020 | Fluit |
| 2020/0343136 | A1 | 10/2020 | Yu et al. |
| 2020/0365456 | A1 | 11/2020 | Thombare et al. |

(56) References Cited

U.S. PATENT DOCUMENTS

| | | | |
|---|---|---|---|
| 2020/0402846 | A1 | 12/2020 | Collins et al. |
| 2021/0047726 | A1 | 2/2021 | Liu et al. |
| 2021/0057223 | A1 | 2/2021 | Stevens et al. |
| 2021/0082750 | A1 | 3/2021 | Yu et al. |
| 2021/0090948 | A1 | 3/2021 | Chen et al. |
| 2021/0098532 | A1 | 4/2021 | Wu |
| 2021/0123136 | A1 | 4/2021 | Kalutarage et al. |
| 2021/0140043 | A1* | 5/2021 | Thombare ......... C23C 16/45527 |
| 2021/0151352 | A1 | 5/2021 | Zope et al. |
| 2021/0238736 | A1 | 8/2021 | Butail et al. |
| 2021/0277517 | A1 | 9/2021 | Liu et al. |
| 2021/0285102 | A1 | 9/2021 | Yoon et al. |
| 2021/0313183 | A1 | 10/2021 | Ba et al. |
| 2021/0320034 | A1 | 10/2021 | Lei et al. |
| 2021/0327694 | A1 | 10/2021 | Houlahan, Jr. et al. |
| 2021/0348271 | A1 | 11/2021 | Mishra et al. |
| 2021/0407809 | A1 | 12/2021 | Zope et al. |
| 2022/0013365 | A1 | 1/2022 | Van Cleemput et al. |
| 2022/0018017 | A1 | 1/2022 | Kim et al. |
| 2022/0037163 | A1 | 2/2022 | Yang et al. |
| 2022/0044929 | A1 | 2/2022 | Xiao et al. |
| 2022/0093597 | A1 | 3/2022 | Ouellette et al. |
| 2022/0139713 | A1 | 5/2022 | Färm et al. |
| 2022/0170155 | A1 | 6/2022 | Blakeney |
| 2022/0186370 | A1* | 6/2022 | Nannapaneni ...... C23C 16/0272 |
| 2022/0195598 | A1 | 6/2022 | Collins et al. |
| 2022/0216105 | A1 | 7/2022 | Zope et al. |
| 2022/0220136 | A1 | 7/2022 | Leoncini et al. |
| 2022/0220139 | A1 | 7/2022 | Leoncini et al. |
| 2022/0220607 | A1 | 7/2022 | Leoncini et al. |
| 2022/0223471 | A1 | 7/2022 | Thombare et al. |
| 2022/0262640 | A1 | 8/2022 | Jandl et al. |
| 2022/0285211 | A1 | 9/2022 | Färm et al. |
| 2022/0298624 | A1 | 9/2022 | Blakeney et al. |
| 2022/0325410 | A1 | 10/2022 | Yoon et al. |
| 2022/0328317 | A1 | 10/2022 | Na et al. |
| 2022/0341034 | A1 | 10/2022 | Aydin et al. |
| 2022/0356579 | A1 | 11/2022 | Collins et al. |
| 2022/0359211 | A1 | 11/2022 | Van Cleemput et al. |
| 2022/0375792 | A1 | 11/2022 | Schloss et al. |
| 2022/0389579 | A1 | 12/2022 | Thombare et al. |
| 2023/0015781 | A1 | 1/2023 | Someshwar et al. |
| 2023/0203645 | A1 | 6/2023 | Liu et al. |
| 2023/0290680 | A1 | 9/2023 | Collins et al. |
| 2023/0295803 | A1 | 9/2023 | Yan et al. |
| 2023/0298896 | A1 | 9/2023 | Veber et al. |
| 2023/0323543 | A1 | 10/2023 | Ailihumaer et al. |
| 2023/0326790 | A1 | 10/2023 | Tarafdar et al. |
| 2024/0047269 | A1 | 2/2024 | Na et al. |
| 2024/0052486 | A1 | 2/2024 | Blakeney |
| 2024/0136192 | A1 | 4/2024 | Schloss et al. |
| 2024/0234152 | A9 | 7/2024 | Schloss et al. |
| 2024/0297075 | A1 | 9/2024 | Thombare et al. |
| 2024/0401196 | A1 | 12/2024 | Thombare et al. |
| 2025/0029834 | A1 | 1/2025 | Zope et al. |
| 2025/0029840 | A1 | 1/2025 | Van Cleemput et al. |
| 2025/0038003 | A1 | 1/2025 | Mandia et al. |
| 2025/0069948 | A1 | 2/2025 | Mandia et al. |
| 2025/0132157 | A1 | 4/2025 | Bhadauriya et al. |
| 2025/0179635 | A1 | 6/2025 | Thombare et al. |
| 2025/0183097 | A1 | 6/2025 | Lai et al. |
| 2025/0226227 | A1 | 7/2025 | Austin et al. |
| 2025/0246434 | A1 | 7/2025 | Lee et al. |
| 2025/0259894 | A1 | 8/2025 | Griffiths et al. |
| 2025/0285920 | A1 | 9/2025 | Schloss et al. |
| 2025/0287675 | A1 | 9/2025 | Mahenderkar et al. |
| 2025/0323045 | A1 | 10/2025 | Jandl et al. |
| 2025/0323046 | A1 | 10/2025 | Na et al. |
| 2025/0382703 | A1 | 12/2025 | Fox et al. |
| 2026/0022453 | A1 | 1/2026 | Lee et al. |
| 2026/0092369 | A1 | 4/2026 | Thombare et al. |
| 2026/0136848 | A1 | 5/2026 | Mandia et al. |

FOREIGN PATENT DOCUMENTS

| | | | |
|---|---|---|---|
| CN | 1957446 | A | 5/2007 |
| CN | 101142670 | A | 3/2008 |
| CN | 101595550 | A | 12/2009 |
| CN | 101752299 | A | 6/2010 |
| CN | 101207019 | B | 12/2010 |
| CN | 102206387 | A | 10/2011 |
| CN | 102206387 | B | 4/2014 |
| CN | 104752339 | A | 7/2015 |
| CN | 104813444 | A | 7/2015 |
| CN | 105097446 | A | 11/2015 |
| CN | 105280549 | A | 1/2016 |
| CN | 106575626 | A | 4/2017 |
| CN | 107305838 | A | 10/2017 |
| CN | 107710443 | A | 2/2018 |
| CN | 107768304 | A | 3/2018 |
| CN | 107946234 | A | 4/2018 |
| CN | 108597983 | A | 9/2018 |
| CN | 109072424 | A | 12/2018 |
| CN | 109563621 | A | 4/2019 |
| CN | 109661481 | A | 4/2019 |
| CN | 112420488 | A | 2/2021 |
| CN | 114342062 | A | 4/2022 |
| EP | 1167567 | A1 | 1/2002 |
| EP | 1728894 | A1 | 12/2006 |
| EP | 1806352 | A1 | 7/2007 |
| JP | S56134739 | A | 10/1981 |
| JP | S56134770 | A | 10/1981 |
| JP | S595246 | A | 1/1984 |
| JP | S62142779 | A | 6/1987 |
| JP | S63118068 | A | 5/1988 |
| JP | H01181516 | A | 7/1989 |
| JP | H02231714 | A | 9/1990 |
| JP | H03131023 | A | 6/1991 |
| JP | H06168944 | A | 6/1994 |
| JP | H10176273 | A | 6/1998 |
| JP | H11233451 | A | 8/1999 |
| JP | H11238736 | A | 8/1999 |
| JP | 2001102580 | A | 4/2001 |
| JP | 2001172049 | A | 6/2001 |
| JP | 2001257177 | A | 9/2001 |
| JP | 2001274105 | A | 10/2001 |
| JP | 2001284360 | A | 10/2001 |
| JP | 3302108 | B2 | 7/2002 |
| JP | 2002305162 | A | 10/2002 |
| JP | 2003528215 | A | 9/2003 |
| JP | 2005150416 | A | 6/2005 |
| JP | 2006511716 | A | 4/2006 |
| JP | 2007019375 | A | 1/2007 |
| JP | 2007182443 | A | 7/2007 |
| JP | 4125696 | B2 | 7/2008 |
| JP | 2008205219 | A | 9/2008 |
| JP | 2008211183 | A | 9/2008 |
| JP | 2011035366 | A | 2/2011 |
| JP | 4910573 | B2 | 4/2012 |
| JP | 2012246531 | A | 12/2012 |
| JP | 2014074190 | A | 4/2014 |
| JP | 2014511380 | A | 5/2014 |
| JP | 2014168070 | A | 9/2014 |
| JP | 2014187208 | A | 10/2014 |
| JP | 2015021175 | A | 2/2015 |
| JP | 2015510547 | A | 4/2015 |
| JP | 2016072587 | A | 5/2016 |
| JP | 2016098406 | A | 5/2016 |
| JP | 2016516892 | A | 6/2016 |
| JP | 2016164131 | A | 9/2016 |
| JP | 2017008412 | A | 1/2017 |
| JP | 2017053024 | A | 3/2017 |
| JP | 2017525156 | A | 8/2017 |
| JP | 2018035375 | A | 3/2018 |
| JP | 2018515692 | A | 6/2018 |
| JP | 2019502253 | A | 1/2019 |
| JP | 2019044266 | A | 3/2019 |
| JP | 2019527302 | A | 9/2019 |
| JP | 2019186508 | A | 10/2019 |
| JP | 2019192906 | A | 10/2019 |
| JP | 2020029617 | A | 2/2020 |
| JP | 2020029618 | A | 2/2020 |

(56) References Cited

FOREIGN PATENT DOCUMENTS

| | | | |
|---|---|---|---|
| JP | 2020043139 | A | 3/2020 |
| JP | 2020059916 | A | 4/2020 |
| JP | 2020513065 | A | 4/2020 |
| JP | 2020176332 | A | 10/2020 |
| JP | 2020530663 | A | 10/2020 |
| JP | 2021503551 | A | 2/2021 |
| JP | 2021523983 | A | 9/2021 |
| JP | 2021535575 | A | 12/2021 |
| JP | 2023095239 | A | 7/2023 |
| JP | 7485736 | B2 | 5/2024 |
| KR | 0138381 | B1 | 6/1998 |
| KR | 20030043201 | A | 6/2003 |
| KR | 100477840 | B1 | 6/2005 |
| KR | 20050054122 | A | 6/2005 |
| KR | 20070073636 | A | 7/2007 |
| KR | 20100068845 | A | 6/2010 |
| KR | 20100096488 | A | 9/2010 |
| KR | 20110014069 | A | 2/2011 |
| KR | 20110024932 | A | 3/2011 |
| KR | 20130088487 | A | 8/2013 |
| KR | 20140034081 | A | 3/2014 |
| KR | 20150005533 | A | 1/2015 |
| KR | 20150063562 | A | 6/2015 |
| KR | 20150077376 | A | 7/2015 |
| KR | 20150108780 | A | 9/2015 |
| KR | 20150128615 | A | 11/2015 |
| KR | 20160015157 | A | 2/2016 |
| KR | 20160072054 | A | 6/2016 |
| KR | 20160098986 | A | 8/2016 |
| KR | 20170042297 | A | 4/2017 |
| KR | 101745074 | B1 | 6/2017 |
| KR | 20170095801 | A | 8/2017 |
| KR | 20170120498 | A | 10/2017 |
| KR | 20180009702 | A | 1/2018 |
| KR | 20180018372 | A | 2/2018 |
| KR | 20180019487 | A | 2/2018 |
| KR | 20180114159 | A | 10/2018 |
| KR | 20180118055 | A | 10/2018 |
| KR | 20190009245 | A | 1/2019 |
| KR | 20190024806 | A | 3/2019 |
| KR | 20190024823 | A | 3/2019 |
| KR | 20190024834 | A | 3/2019 |
| KR | 20190024841 | A | 3/2019 |
| KR | 20190028743 | A | 3/2019 |
| KR | 20190086054 | A | 7/2019 |
| KR | 20190130046 | A | 11/2019 |
| KR | 20200026711 | A | 3/2020 |
| KR | 20200056543 | A | 5/2020 |
| KR | 20200076757 | A | 6/2020 |
| KR | 20200078423 | A | 7/2020 |
| KR | 20200090108 | A | 7/2020 |
| KR | 20200140923 | A | 12/2020 |
| KR | 20210016063 | A | 2/2021 |
| KR | 20210030775 | A | 3/2021 |
| KR | 20210127262 | A | 10/2021 |
| KR | 20210156444 | A | 12/2021 |
| TW | 494531 | B | 7/2002 |
| TW | 201123305 | A | 7/2011 |
| TW | 201504247 | A | 2/2015 |
| TW | 201542857 | A | 11/2015 |
| TW | 201705490 | A | 2/2017 |
| TW | 201710543 | A | 3/2017 |
| TW | 201718942 | A | 6/2017 |
| TW | 201738405 | A | 11/2017 |
| TW | 201741325 | A | 12/2017 |
| TW | 201812069 | A | 4/2018 |
| TW | 201812070 | A | 4/2018 |
| TW | 201903847 | A | 1/2019 |
| TW | 201907037 | A | 2/2019 |
| TW | 201911378 | A | 3/2019 |
| TW | 201920736 | A | 6/2019 |
| TW | 201920740 | A | 6/2019 |
| TW | 202020203 | A | 6/2020 |
| TW | 202030861 | A | 8/2020 |
| TW | 202039911 | A | 11/2020 |
| TW | 202043519 | A | 12/2020 |
| TW | 202117050 | A | 5/2021 |
| TW | 202129049 | A | 8/2021 |
| WO | WO-2006036865 | A2 | 4/2006 |
| WO | WO-2007005088 | A2 | 1/2007 |
| WO | WO-2012047591 | A1 | 4/2012 |
| WO | WO-2014052642 | A1 | 4/2014 |
| WO | WO-2014066792 | A1 | 5/2014 |
| WO | WO-2014140863 | A2 | 9/2014 |
| WO | WO-2015023404 | A1 | 2/2015 |
| WO | WO-2016191432 | A1 | 12/2016 |
| WO | WO-2017070634 | A1 | 4/2017 |
| WO | WO-2017091571 | A1 | 6/2017 |
| WO | WO-2017143246 | A1 | 8/2017 |
| WO | WO-2018013778 | A1 | 1/2018 |
| WO | WO-2018191183 | A1 | 10/2018 |
| WO | WO-2019036214 | A1 | 2/2019 |
| WO | WO-2019099233 | A1 | 5/2019 |
| WO | WO-2019118684 | A1 | 6/2019 |
| WO | WO-2019232344 | A1 | 12/2019 |
| WO | WO-2020023790 | A1 | 1/2020 |
| WO | WO-2020028587 | A1 | 2/2020 |
| WO | WO-2020041213 | A1 | 2/2020 |
| WO | WO-2020101336 | A1 | 5/2020 |
| WO | WO-2020106649 | A1 | 5/2020 |
| WO | WO-2020159882 | A1 | 8/2020 |
| WO | WO-2020185618 | A1 | 9/2020 |
| WO | WO-2020223038 | A1 | 11/2020 |
| WO | WO-2021028587 | A1 | 2/2021 |
| WO | WO-2021035236 | A1 | 2/2021 |
| WO | WO-2021042114 | A1 | 3/2021 |
| WO | WO-2021046058 | A1 | 3/2021 |
| WO | WO-2021076636 | A1 | 4/2021 |
| WO | WO-2021178399 | A1 | 9/2021 |
| WO | WO-2021237032 | A1 | 11/2021 |
| WO | WO-2022108762 | A1 | 5/2022 |
| WO | WO-2022150270 | A1 | 7/2022 |
| WO | WO-2022221210 | A1 | 10/2022 |
| WO | WO-2022241042 | A1 | 11/2022 |
| WO | WO-2023114648 | A1 | 6/2023 |
| WO | WO-2023229953 | A1 | 11/2023 |
| WO | WO-2024049707 | A1 | 3/2024 |
| WO | WO-2024091543 | A1 | 5/2024 |

OTHER PUBLICATIONS

CAS Registry No. 749862-34-8, CAS SciFinder, 2025, 2 Pages.

CN Office Action dated Feb. 20, 2025 in CN Application No. 201980038600.8, with English Translation.

CN Office Action dated Feb. 20, 2025 in CN Application No. 201980076277.3 with English translation.

CN Office Action dated Feb. 28, 2025 in CN Application No. 201980049916.7, with English Translation.

CN Office Action dated Jul. 9, 2024 in CN Application No. 201980049916.7 with English translation.

CN Office Action dated Jun. 7, 2024 in CN Application No. 201880074995.2, with English Translation.

CN Office Action dated Jun. 27, 2024 in CN Application No. 201980076277.3 with English translation.

CN Office Action dated Mar. 6, 2025 in CN Application No. 202080059499.7, with English Translation.

CN Office Action dated May 28, 2025 in CN Application No. 201880074995.2 with English translation.

CN Office Action dated May 28, 2025 in CN Application No. 201980038600.8 with English translation.

CN Office Action dated May 29, 2025 in CN Application No. 202080072306.1, with English Translation.

CN Office Action dated May 30, 2025 in CN Application No. 202080059499.7, with English Translation.

CN Office Action dated May 30, 2025 in CN Application No. 202080062173.X, with English Translation.

CN Office Action dated Nov. 29, 2024 in CN Application No. 201880074995.2, with English Translation.

CN Office Action dated Oct. 17, 2024 in CN Application No. 202080059499.7 with English translation.

(56) References Cited

OTHER PUBLICATIONS

International Preliminary Report on Patentability and Written Opinion dated Apr. 24, 2025 in PCT Application No. PCT/US2023/034858.
International Preliminary Report on Patentability and Written Opinion dated Jan. 2, 2025 in PCT Application No. PCT/US2023/069018.
International Preliminary Report on Patentability and Written Opinion dated May 8, 2025 in PCT Application No. PCT/US2023/035873.
International Preliminary Report on Patentability and Written Opinion dated Nov. 14, 2024 in PCT Application No. PCT/US2023/019795.
International Preliminary Report on Patentability and Written Opinion dated Oct. 17, 2024 in PCT Application No. PCT/US2023/017635.
International Preliminary Report on Patentability and Written Opinion dated Oct. 31, 2024 in PCT Application No. PCT/US2023/019000.
International Preliminary Report on Patentability and Written Opinion dated Sep. 6, 2024 in PCT Application No. PCT/US2023/062877.
International Preliminary Reporton Patentability and Written Opinion dated Nov. 7, 2024 in PCT Application No. PCT/US2023/019800.
International Search Report and Written Opinion dated Jul. 23, 2024 in PCT Application No. PCT/US2024/023361.
International Search Report and Written Opinion dated Jun. 11, 2025 in PCT Application No. PCT/US2025/017720.
International Search Report and Written Opinion dated Oct. 22, 2024 in PCT Application No. PCT/US2024/037234.
Jiang P., et al., "Dependence of Crystal Structure and Work Function of WNX Films on the Nitrogen Content," Applied Physics Letters, 2006, vol. 89, (122107) pp. 1-3.
JP Decision to Grant and Search Report dated Jul. 1, 2025 in JP Application No. 2021-527153, with English translation.
JP Notice of Allowances dated Oct. 1, 2024 in JP Application No. 2021-543355 with English translation.
JP Notice of Allowances dated Oct. 15, 2024 in JP Application No. 2021-552861 with English translation.
JP Office Action dated Aug. 6, 2024 in JP Application No. 2023-547183, with English Translation.
JP Office Action dated Aug. 20, 2024 in JP Application No. 2022-514153, with English Translation.
JP Office Action dated Jan. 7, 2025 in JP Application No. 2021-527153 with English translation.
JP Office Action dated Jan. 28, 2025 in JP Application No. 2022-571128, with English Translation.
JP Office Action dated Jul. 8, 2025 in JP Application No. 2022-514153, with English Translation.
JP Office Action dated Jul. 16, 2024 in JP Application No. 2021-527153, with English Translation.
JP Office Action dated Jun. 3, 2025 in JP Application No. 2022141888, with English Translation.
JP Office Action dated Jun. 3, 2025 in JP Application No. 2022509591, with English Translation.
JP Office Action dated Mar. 4, 2025 in JP Application No. 2022-514153, with English Translation.
JP Office Action dated May 7, 2025 in JP Application No. 2022-141887, with English Translation.
JP Office Action dated Nov. 12, 2024 in JP Application No. 2022-522581 with English translation.
JP Office Action dated Oct. 29, 2024 in JP Application No. 2022-141887 with English translation.
JP Office Action dated Sep. 3, 2024 in JP Application No. 2022-141888 with English translation.
JP Office Action dated Sep. 3, 2024 in JP Application No. 2022-509591, with English Translation.
KR Notice of Allowance dated Feb. 11, 2025 in KR Application No. 10-2020-7034800, with English Translation.
KR Notice of Allowance dated Nov. 25, 2024 in KR Application No. 10-2023-0081299, with English Translation.
KR Notice of Allowances dated Aug. 28, 2024 in KR Application No. 10-2023-7028915 with English Translation.
KR Notice of Allowances dated Jan. 8, 2025 in KR Application No. 10-2022-7031314 with English Translation.
KR Office Action dated Apr. 21, 2025 in KR Application No. 10-2021-7018803, with English Translation.
KR Office Action dated Apr. 22, 2025 in KR Application No. 10-2021-7026960, with English Translation.
KR Office Action dated Dec. 3, 2024 in KR Application No. 10-2021-7032632 with English Translation.
KR Office Action dated Dec. 20, 2024 in KR Application No. 10-2022-7015736, with English Translation.
KR Office Action dated Feb. 21, 2025 in KR Application No. 10-2022-7009362, with English Translation.
KR Office Action dated Feb. 26, 2025 in KR Application No. 10-2020-7017697, with English Translation.
KR Office Action dated Jul. 8, 2025 in KR Application No. 10-2022-7045710, with English Translation.
KR Office Action dated Jul. 9, 2025 in KR Application No. 10-2022-7011026, with English Translation.
KR Office Action dated Jul. 17, 2025 in KR Application No. 10-2022-7045707, with English Translation.
KR Office Action dated Jun. 27, 2024 in KR Application No. 10-2023-0081299, with English Translation.
KR Office Action dated Nov. 21, 2024 in KR Application No. 10-2021-7005949 with English Translation.
KR Office Action dated Oct. 28, 2024 in KR Application No. 10-2021-7018803 with English Translation.
KR Office Action dated Sep. 26, 2024 in KR Application No. 10-2022-7031314, with English Translation.
SG Search Report and Written Opinion dated Aug. 22, 2024 in SG Application No. 11202203845Q.
SG Written Opinion dated Jan. 9, 2025 in SG Application No. 11202202087P.
SG Written Opinion dated Mar. 4, 2025 in SG Application No. 11202201453T.
SG Written Opinion dated Mar. 28, 2025 in SG Application No. 11202203845.
Stoffelbach F., et al., "A Bis(Diazadiene) Adduct of MoCl2: Mononuclear, Octahedral, Undistorted and Diamagnetic," European Journal of Inorganic Chemistry, 2004, (4), pp. 726-731.
Stoffelback F., et al., "Half-Sandwich Molybdenum(III) Compounds Containing Diazadiene Ligands and Their Use in the Controlled Radical Polymerization of Styrene," Journal of Organometallic Chemistry, Dec. 2002, vol. 663 (1-2), pp. 269-276.
TW Office Action and Search Report dated Jul. 2, 2025 in TW Application No. 110142342, with English Translation.
TW Office Action and Search Report dated May 13, 2025 in TW Application No. 111100209, with English Translation.
TW Office Action dated Apr. 15, 2025 in TW Application No. 110118417, with English Translation.
U.S. Corrected Notice of Allowance dated Mar. 6, 2025 in U.S. Appl. No. 17/639,846.
U.S. Final Office Action dated Feb. 4, 2025 in U.S. Appl. No. 18/310,523.
U.S. Final Office Action dated Jan. 3, 2025 in U.S. Appl. No. 17/662,220.
U.S. Final Office Action dated Nov. 22, 2024 in U.S. Appl. No. 17/639,846.
U.S. Final Office Action dated Oct. 10, 2024 in U.S. Appl. No. 18/379,397.
U.S. Non-Final Office Action dated Apr. 9, 2025 in U.S. Appl. No. 18/286,994.
U.S. Non-Final Office Action dated Aug. 7, 2024 in U.S. Appl. No. 18/310,523.
U.S. Non-Final Office Action dated Jul. 23, 2025 in U.S. Appl. No. 18/559,783.
U.S. Non-Final Office Action dated Jul. 24, 2024 in U.S. Appl. No. 17/763,529.
US Non-Final Office Action dated Jul. 29, 2025 in U.S. Appl. No. 17/999,255.

(56) References Cited

OTHER PUBLICATIONS

U.S. Non-Final Office Action dated Mar. 21, 2025 in U.S. Appl. No. 18/379,397.
US Non-Final Office Action dated May 6, 2025 in U.S. Appl. No. 18/799,905.
U.S. Non-Final Office Action dated May 23, 2025 in U.S. Appl. No. 18/310,523.
U.S. Non-Final Office Action dated Sep. 5, 2024 in U.S. Appl. No. 17/814,206.
U.S. Notice of Allowance dated Feb. 11, 2025 in U.S. Appl. No. 17/763,529.
U.S. Notice of Allowance dated Feb. 21, 2025 in U.S. Appl. No. 17/763,529.
U.S. Notice of Allowance dated Feb. 26, 2025 in U.S. Appl. No. 17/639,846.
U.S. Notice of Allowance dated Jul. 3, 2024 in U.S. Appl. No. 17/294,378.
U.S. Notice of Allowance dated Mar. 5, 2025 in U.S. Appl. No. 17/814,206.
U.S. Notice of Allowance dated Mar. 21, 2025 in U.S. Appl. No. 17/662,220.
U.S. Appl. No. 18/837,560, inventors Hsieh Y, et al., filed Aug. 9, 2024.
U.S. Appl. No. 18/857,125, inventors Griffiths M.B, et al., filed Oct. 15, 2024.
U.S. Appl. No. 18/859,971, inventors Mahenderkar N.K, et al., filed Oct. 24, 2024.
U.S. Appl. No. 18/877,501, inventors Fox A.R et al., filed Dec. 20, 2024.
U.S. Appl. No. 19/119,205, inventors Mandia D.J et al., filed Apr. 8, 2025.
U.S. Appl. No. 19/124,236, Inventors Lee et al., filed Apr. 24, 2025.
U.S. Appl. No. 19/204,379, inventors Schloss L et al., filed May 9, 2025.
U.S. Appl. No. 19/217,348, inventors Na J.S et al., filed May 23, 2025.
U.S. Appl. No. 19/249,964, inventors Jandl A et al., filed Jun. 25, 2025.
U.S. Restriction Requirement dated Apr. 10, 2025 in U.S. Appl. No. 17/999,255.
Anonymous, "Lam Research enables next-generation memory with industry's first ALD process for low-fluorine tungsten fill" Semiconductor Digest News and Industry Trends for Solid State Technology, Aug. 2016, 2 Pages.
Barry, S.T., "Amidinates, Guanidinates and Iminopyrrolidinates: Understanding Precursor Thermolysis to Design a Better Ligand," Coordination Chemistry Reviews, Dec. 2013, vol. 257(23-24), pp. 3192-3201.
Barry, S.T., et al., "The Chemistry of Inorganic Precursors during the Chemical Deposition of Films on Solid Surfaces," Accounts of chemical research, 2018, vol. 51, pp. 800-809.
Becker, J., et al., "Diffusion Barrier Properties of Tungsten Nitride Films Grown by Atomic Layer Deposition From bis(tert-butylimido) bis(dimethylamido)tungsten and ammonia," Applied Physics Letters, 2003, vol. 82 (14), pp. 2239-2241.
Chinese First Office Action dated Jan. 4, 2021 issued in Application No. CN 201710700258.6.
Chinese Second Office Action dated Jun. 17, 2021 issued in Application No. CN 201710700258.6.
Chiu, H. et al., "Deposition of Molybdenum Carbonitride Thin Films from $Mo(NBu^t)_2(NHBu^t)_2$", J. Mater. Res, Jul. 1994, vol. 9, No. 7, pp. 1622-1624.
CN Office Action dated Dec. 28, 2023 in CN Application No. 202080059499.7 with EnglishTranslation.
CN Office Action dated Feb. 28, 2023 in Application No. 201880038116.0 with English translation.
CN Office Action dated Jan. 13, 2023 in CN Application No. CN201980049916.7 with English Translation.
CN Office Action dated Jan. 16, 2023 in Application No. CN202080020646.X with English translation.
CN Office Action dated Jan. 18, 2024 in CN Application No. 202080020646.X with English translation.
CN Office Action dated May 31, 2024 in CN Application No. 201980038600.8 with English translation.
CN Office Action dated Nov. 17, 2022, in Application No. CN202080011300.3 with English translation.
CN Office Action dated Sep. 24, 2023, in Application No. CN202080020646.X with English translation.
CN Office Action dated Sep. 28, 2023, in application No. CN201980049916.7 with English translation.
Colaianni, M.L., et al., "The Adsorption and Dissociation of Carbon Monoxide on Clean and Oxygen-Modified Mo(110) Surfaces," Journal of the American Chemical Society, 1992, vol. 114(10), pp. 3735-3743.
Cotton, F.A., "Strong Homonuclear Metal-Metal Bonds," Accounts of Chemical Research, 1969, vol. 2 (8), pp. 240-247.
Coventor Brochure "3D NAND: Challenges Beyond 96-Layer Memory Arrays", Oct. 12, 2018, pp. 1-4.
Dezelah IV, C.L., et al., "A Low Valent Metalorganic Precursor for the Growth of Tungsten Nitride Thin Films by Atomic Layer Deposition," Journal of Materials Chemistry, 2007, vol. 17, pp. 1109-1116.
Dezelah IV, C.L., et al., "Atomic Layer Deposition of Tungsten(III) Oxide Thin Films from W2(NMe2)6 and Water: Precursor-Based Control of Oxidation State in the Thin Film Material," Journal of the American Chemical Society, Aug. 2, 2006, vol. 128(30), pp. 9638-9639.
Dominique, S. et al., "An alternative to Tungsten in 3D-NAND technology", IEEE International Interconnect Technology Conference (IITC), 2021, pp. 1-3.
EP Extended European Search report dated Dec. 14, 2023, in Application No. EP20854552.5.
EP Partial Supplementary European Search report dated Sep. 13, 2023, in Application No. EP20854552.5.
Final Office Action dated May 23, 2019 issued in U.S. Appl. No. 15/948,143.
Final Office Action dated Sep. 2, 2021 issued in U.S. Appl. No. 16/947,286.
Gall D., "Electron Mean Free Path in Elemental Metals," Journal of Applied Physics, Feb. 23, 2016, vol. 119, 6 Pages.
International Preliminary Report on Patentability dated Dec. 1, 2022, in PCT Application No. PCT/US2021/033564.
International Preliminary Report on Patentability dated Mar. 10, 2022, in Application No. PCT/US2020/070434.
International Preliminary Report on Patentability dated Mar. 3, 2022, in Application No. PCT/US2020/070390.
International Search Report and Written Opinion dated Feb. 3, 2021, in Application No. PCT/US2020/055596.
International Search Report and Written Opinion dated Jun. 9, 2022 in International Application No. PCT/US2022/017005.
International Search Report and Written Opinion dated Sep. 9, 2021 in Application No. PCT/US2021/033564.
International Preliminary Report on Patentability and Written Opinion dated Jun. 27, 2024 in PCT Application No. PCT/US2022/080705.
International Preliminary Report on Patentability and Written Opinion dated Jun. 27, 2024 in PCT Application No. PCT/US2022/080863.
International Preliminary Report on Patentability dated Apr. 28, 2022, in PCT Application No. PCT/US2020/055596.
International Preliminary Report on Patentability dated Aug. 12, 2021, issued in Application No. PCT/US2020/015241.
International Preliminary Report on Patentability dated Feb. 4, 2021 in Application No. PCT/US2019/043514.
International Preliminary Report on Patentability dated Jul. 20, 2023, in PCT Application No. PCT/US2022/011053.
International Preliminary Report on Patentability dated Jun. 1, 2023, in PCT Application No. PCT/US2021/058099.
International Preliminary Report on Patentability dated Jun. 3, 2021 in Application No. PCT/US2019/062067.
International Preliminary Report on Patentability dated Jun. 4, 2020 in Application No. PCT/US2018/061803.

(56) References Cited

OTHER PUBLICATIONS

International Preliminary Report on Patentability dated Mar. 17, 2022 in PCT Application No. PCT/US2020/048951.
International Preliminary Report on Patentability dated Nov. 12, 2020 in Application No. PCT/US2019/030712.
International Preliminary Report on Patentability dated Oct. 24, 2019 in Application No. PCT/US2018/026746.
International Preliminary Report on Patentability dated Oct. 26, 2023, in PCT Application No. PCT/US2022/024295.
International Preliminary Report on Patentability dated Sep. 7, 2023, in PCT Application No. PCT/US2022/017005.
International Preliminary Report on Patentability dated Sep. 23, 2021 issued in Application No. PCT/US2020/021543.
International Search Report and Written Opinion dated Apr. 7, 2023 in PCT Application No. PCT/US2022/080705.
International Search Report and Written Opinion dated Apr. 25, 2022, for International Application No. PCT/US2022/011053.
International Search Report and Written Opinion dated Apr. 27, 2023 in PCT Application No. PCT/US2022/080863.
International Search Report and Written Opinion dated Aug. 2, 2022 in Application No. PCT/US2022/024295.
International Search Report and Written Opinion dated Aug. 11, 2023, in Application No. PCT/US2023/019795.
International Search Report and Written Opinion dated Aug. 16, 2023, in Application No. PCT/US2023/017635.
International Search Report and Written Opinion dated Aug. 16, 2023, in Application No. PCT/US2023/019800.
International Search Report and Written Opinion dated Aug. 16, 2023, in ApplicationNo. PCT/US2023/019000.
International Search Report and Written Opinion dated Aug. 19, 2019 in Application No. PCT/US2019/030712.
International Search Report and Written Opinion dated Dec. 4, 2020, in PCT Application No. PCT/US2020/048951.
International Search Report and Written Opinion dated Feb. 4, 2021, in PCT Application No. PCT/US2020/070390.
International Search Report and Written Opinion dated Feb. 7, 2024 in PCT Application No. PCT/US2023/034858.
International Search Report and Written Opinion dated Feb. 16, 2024 in PCT Application No. PCT/US2023/035873.
International Search Report and Written Opinion dated Jul. 1, 2020 in Application No. PCT/US2020/021543.
International Search Report and Written Opinion dated Jul. 27, 2018 in Application No. PCT/US2018/026746.
International Search Report and Written Opinion dated Jun. 19, 2023, in Application No. PCT/US2023/062877.
International Search Report and Written Opinion dated Jun. 3, 2020, issued in Application No. PCT/US2020/015241.
International Search Report and Written Opinion dated Mar. 3, 2022, in Application No. PCT/US2021/058099.
International Search Report and Written Opinion dated Mar. 8, 2019 in Application No. PCT/US2018/061803.
International Search Report and Written Opinion dated Mar. 9, 2020 in Application No. PCT/US2019/062067.
International Search Report and Written Opinion dated Nov. 11, 2019 in Application No. PCT/US2019/043514.
International Search Report and Written Opinion dated Nov. 11, 2020 issued in Application No. PCT/US2020/070434.
International Search Report and Written Opinion dated Oct. 17, 20223 in PCT Application No. PCT/US2023/069018.
International Search Report and Written Opinion dated Sep. 6, 2023, in Application No. PCT/US2023/023023.
International Search Report and Written Opinion dated Sep. 7, 2022 in ApplicationNo. PCT/US2022/028845.
Ishihara, S., et al., "MOCVD of Monolayer MoS2 using Novel Molybdenum Precursor i-Pr2DADMo(CO)3," Materials Research Society, 2018, vol. 3, pp. 379-384.
Jamie, W. et al., "In Situ Atomic Layer Deposition and Electron Tunneling Characterization of Monolayer $Al_2O_3$ on Fe for Magnetic Tunnel Junctions", AIP Advances, 2018, vol. 8, No. 125218, pp. 1-9.
Jang, Y., et al., "Highly-conformal Nanocrystalline Molybdenum Nitride Thin Films by Atomic Layer Deposition as a Diffusion Barrier Against Cu," Journal of Alloys and Compounds, 2016, vol. 663, pp. 651-658.
Johnson, R.W., Hultqvist, A., Bent, S.F., "A brief review of atomic layer deposition: from fundamentals to applications", Materials today, (Jun. 1, 2014), 17(5):236-46.
JP Office Action dated Apr. 19, 2022 in Application No. JP20200504286 with English translation.
JP Office Action dated Dec. 12, 2023 in JP Application No. 2021-527153 with English Translation.
JP Office Action dated Dec. 26, 2023, in application No. JP20220141888 with English translation.
JP Office Action dated Feb. 6, 2024 in JP Application No. 2021-543355 with English translation.
JP Office Action dated Feb. 20, 2024 in JP Application No. 2023-547183 with English translation.
JP Office Action dated Feb. 27, 2024 in Application No. JP2022-522581 with English Translation.
JP Office Action dated Jun. 6, 2023 in Application No. JP2020561743 With English translation.
JP Office Action dated Jun. 11, 2024 in JP Application No. 2023-95239, with English Translation.
JP Office Action dated Mar. 5, 2024 in JP Application No. 2022-141887, with English Translation.
JP Office Action dated Mar. 19, 2024 in JP Application No. 2020-561743, with English Translation.
JP Office Action dated Oct. 3, 2023 in Application No. JP2022-522581 with English Translation.
JP Office Action dated Oct. 3, 2023 in Application No. JP2023-95239 with English Translation.
JP Office Action dated Sep. 5, 2023, in Application No. JP2022-145721 with English translation.
Juppo, et al., "Deposition of Molybdenum Thin Films by an Alternate Supply of MoCl 5 and Zn," Journal of Vacuum Science and Technology A, vol. 16, Sep./Oct. 1998, doi: 10.1116/1.581430, pp. 2845-2850.
Karunarathne, M.C., et al., "Synthesis, Structural Characterization, and Volatility Evaluation of Zirconium and Hafnium Amidate Complexes," Journal of Organometallic Chemistry, 2017, vol. 847, pp. 204-212.
Kerrigan, M.M., et al., "Low Temperature, Selective Atomic Layer Deposition of Cobalt Metal Films Using Bis(1,4-di-tert-butyl-1,3-diazadienyl)cobalt and Alkylamine Precursors," Chemistry of Materials, 2017, vol. 29(17), pp. 7458-7466.
Kerrigan, M.M., et al., "Low Temperature, Selective Atomic Layer Deposition of Nickel Metal Thin Films," ACS Applied Materials & Interfaces, 2018, vol. 10(16), pp. 14200-14208.
Kim, K. et al., "Simulation of Residual Stress and Its Impact on a Poly-Silicon Channel for Three-Dimensional, Stacked, Vertical-NAND Flash Memories", Journal of the Korean Physical Society, 2017, vol. 70 (12), pp. 1041-1048.
Kim, T., et al., "Thermal Chemistry of Cu(I)-Iminopyrrolidinate and Cu(I)-Guanidinate Atomic Layer Deposition (ALD) Precursors on Ni(110) Single-Crystal Surfaces," Chemistry of Materials, 2013, vol. 25, pp. 3630-3639.
Knisley, T.J., et al., "Volatility and High Thermal Stability in Mid to Late First Row Transition Metal Diazadienyl Complexes," Organometallics, 2011, vol. 30(18), pp. 5010-5017.
KR Office Action dated Dec. 15, 2023 in KR Application No. 10-2023-7028915, with English Translation.
KR Office Action dated Feb. 21, 2022, in Application No. KR10-2017-0102113 with English Translation.
KR Office Action dated Jan. 27, 2023 in Application No. KR10-2017-0102113 with English Translation.
KR Office Action dated Jul. 28, 2023, in Application No. KR10-2023-0081299 with English Translation.
KR Office Action dated Mar. 1, 2024 in KR Application No. 10-2021-7018803, with English Translation.
KR Office Action dated Mar. 29, 2024 in KR Application No. 10-2020-7017697 with English translation.
KR Office Action dated May 7, 2024 in KR Application No. 10-2020-7034800, with English Translation.

(56) References Cited

OTHER PUBLICATIONS

KR Office Action dated May 30, 2022, in Application No. KR10-2019-7033130 With English Translation.
KR Office Action dated Nov. 14, 2023, in KR Application No. 10-2022-7031314 with English Translation.
KR Office Action dated Oct. 27, 2022 in Application No. KR10-2022-7026373 with English translation.
KR Office Action dated Sep. 27, 2022, in Application No. KR10-2017-0102113 with English translation.
Kurek, A. et al., "Recent Advances Using Guanidinate Ligands for Chemical Vapour Deposition (CVD) and Atomic Layer Deposition (ALD) Applications," Australian Journal of Chemistry, Jun. 2014, vol. 67, pp. 989-996.
Lee, B. et al., "ALD Tungsten Solves Capacity Challenges in 3D NAND Device Manufacturing", Lam Brochure, Jan. 2019, pp. 1-4.
Li, Z. et al., "Atomic Layer Deposition of Ultrathin Copper Metal Films from a Liquid Copper(I) Amidinate Precursor", Journal of The Electrochemical Society, 2006, vol. 153, No. 11, pp. C787-C794.
Lim, B. et al., "Atomic Layer Deposition of Transition Metals", Nature Materials, 2003, vol. 2, pp. 749-754.
Lin, S. et al., "Effect of Nitrogen on the Physical Properties and work Function of $MoN_x$ Cap Layers on $HfO_2$ Gate Dielectrics", ECS Journal of Solid State Science and Technology, 2014, vol. 3, No. 12, pp. N161-N165.
Majumder et al. "Investigation on the diffusion barrier properties of sputtered Mo/W-N thin films in Cu interconnects," Applied Physics Letters, vol. 91 (2007), pp. 162108-1-162108-3.
Makela, M., et al., "Thermal Atomic Layer Deposition of Continuous and Highly Conducting Gold Thin Films," Chemistry of Materials, 2017, vol. 29, pp. 6130-6136.
Mccain, M.N. et al., "Aerosol-Assisted Chemical Vapor Deposition of Lubricating MoS2 Films. Ferrous Substrates and Titanium Film Doping", Chemistry of Materials, 2008, vol. 20, No. 16, pp. 5438-5443.
Miikkulainen, V. et al., "Atomic Layer Deposition of Molybdenum Nitride from Bis(tert-butylimido)-bis(dimethylamido)molybdenum and Ammonia onto Several Types of Substrate Materials with Equal Growth per Cycle", Chemistry of Materials, 2007, vol. 19, pp. 263-269.
Miikkulainen, V. et al., "Bis(tert-butylimido)-bis(dialkylamido) Complexes of Molybdenum as Atomic Layer Deposition (ALD) Precursors for Molybdenum Nitride: the Effect of the Alkyl Group", Chemical Vapor Deposition, 2008, vol. 14, pp. 71-77.
Mohimi, E, et al., "Low temperature chemical vapor deposition of superconducting molybdenum carbonitride thin films", Journal of Vacuum Science & Technology A , 2019, vol. 37, No. 2, 021503, 6 pages.
Muhtade, M., et al., "Time Influence on Thickness and Grains for Molybdenum Thin Film," 2017, e-ISSN: 2289-8131, vol. 9, No. 2-13.
Nandi, D.K. et al., "Atomic Layer Deposited Molybdenum Nitride Thin Film: A Promising Anode Material for Li Ion Batteries", ACS Applied Material Interfaces, 2014, vol. 6, pp. 6606-6615.
Notice of Allowance dated Apr. 27, 2020 issued in U.S. Appl. No. 16/676,169.
Notice of Allowance dated Aug. 6, 2019 issued in U.S. Appl. No. 15/948,143.
Office Action dated Apr. 27, 2021 issued in U.S. Appl. No. 16/947,286.
Office Action dated Aug. 12, 2021 issued in U.S. Appl. No. 16/764,812.
Office Action dated Feb. 4, 2019 issued in U.S. Appl. No. 15/948,143.
Office Action Requirement for Restriction/Election dated Sep. 22, 2021 issued in U.S. Appl. No. 17/250,452.
Otsuka, S. et al., "A Novel Molybdenum Thiolato Compound, Tetrakis(tert-butylthiolato)molybdenum(IV). Preparation and Crystal and Molecular Structure" Journal of American chemistry society, 1981, vol. 103, pp. 3011-3014.
Ouyang, T., et al., "A Surface Chemistry Route to Molybdenum Sulfide and Germanide Films Using the Single-Source Precursor Tetrakis(diethylaminodithiocarbomato)molybdate(IV)," The Journal of Physical Chemistry B, 2004, vol. 108(5), pp. 17537-17545.
Pol, V. G., et al., "Fabrication of Magnetic Nanoparticles Using Rapet Technique With or Without Employing External Magnetic Field," The Journal of Physical Chemistry C, 2008, vol. 112, pp. 6627-6637.
Qu Jingxin, et al., "Surface Engineering Handbook," Chemical Industry Publishing House, Mar. 31, 1998, p. 277.
Ranade, P. et al., "Work Function Engineering of Molybdenum Gate Electrodes by Nitrogen Implantation", Electrochemical and Solid-State Letters, 2001, vol. 4, No. 11, pp. G85-G87.
Seghete, D. et al., Molybdenum Atomic Layer Deposition Using MoF6 and Si2H6 As the Reactants, Chemistry of Materials, 2011, vol. 23 No. 7, pp. 1668-1678.
SG Office Action dated Oct. 11, 2023, in application No. SG11202201453T.
SG Office Action dated Sep. 19, 2023, in application No. SG11202202087P.
SG Search Report and Written Opinion dated Feb. 10, 2023 in Application No. SG11202109796Q.
SG Written Opinion dated Oct. 4, 2023 in Application No. SG11202109796Q.
Shimizu, H. et al., "Precursor-based designs of nano-structures and their processing for Co(W) alloy films as a single layered barrier/liner layer in future Cu-interconnect", Journal of Materials Chemistry C, 2015, vol. 3, pp. 2500-2510.
Shirazi, M., et al., "Initial Stage of Atomic Layer Deposition of 2D-$MoS_2$ on a $SiO_2$ surface: a DFT study," Physical Chemistry Chemical Physics, 2018, vol. 20 (24), pp. 1-18.
Singapore Written Opinion dated Mar. 15, 2023 issued in Application No. SG11202108217U.
Specification of U.S. Appl. No. 62/425,704 (Electronically filed Nov. 23, 2016).
Stephenson T A., et al., "487. Molybdenum(II) Carboxylates," Journal of the Chemical Society, 1964, pp. 2538-2541.
Sun Yicai, et al., "Design Manufacturing and Application," Metallurgical Industry Publishing House, Apr. 30, 2000, p. 166.
TW Office Action dated Apr. 24, 2024 in TW Application No. 109130013, With English Translation.
TW Office Action dated Aug. 16, 2022, in Application No. TW107141042 with English translation.
TW Office Action dated Aug. 31, 2023, in Application No. TW109102778 with English translation.
TW Office Action dated Dec. 5, 2023 in TW Application No. 109107661 with English translation.
TW Office Action dated Dec. 21, 2023 in Application No. TW108126326 with English translation.
TW Office Action dated Feb. 10, 2023 in Application No. TW107112210 with English translation.
TW Office Action dated May 9, 2024 in TW Application No. 109107661 with English translation.
TW Office Action dated May 22, 2024 in TW Application No. 109135654, with English Translation.
TW Office Action dated Oct. 18, 2021, in application No. TW107112210 with English translation.
TW Office Action dated Oct. 19, 2023 in Application No. TW107112210 with English translation.
TW Office Action dated Sep. 14, 2022, in Application No. TW107112210 with English translation.
U.S Advisory Action dated May 3, 2022 in U.S. Appl. No. 16/764,812.
U.S. Advisory Action dated Oct. 18, 2022, in U.S. Appl. No. 17/250,452.
U.S. Corrected Notice of Allowance dated Feb. 16, 2022, in U.S. Appl. No. 16/724,231.
U.S. Corrected Notice of Allowance dated May 11, 2022, in U.S. Appl. No. 16/724,231.
U.S. Final office Action dated Jul. 25, 2022 in U.S. Appl. No. 17/250,452.
U.S. Final Office Action dated Feb. 2, 2023 in U.S. Appl. No. 17/436,944.
U.S. Final Office Action dated Apr. 12, 2024 in U.S. Appl. No. 17/814,206.

(56) References Cited

OTHER PUBLICATIONS

U.S. Final Office Action dated Feb. 12, 2024 in U.S. Appl. No. 17/589,416.
U.S. Final Office Action dated Jan. 31, 2022 in U.S. Appl. No. 16/764,812.
U.S. Final office Action dated Jun. 26, 2023 in U.S. Appl. No. 17/589,416.
U.S. Final Office Action dated Mar. 1, 2023 in U.S. Appl. No. 17/250,452.
US Final Office Action dated Mar. 29, 2021 issued in U.S. Appl. No. 16/724,231.
U.S. Final Office Action dated May 8, 2024 in U.S. Appl. No. 17/250,452.
U.S. Final Office Action dated May 9, 2024 in U.S. Appl. No. 17/814,207.
U.S. Final Office Action dated May 31, 2023, in U.S. Appl. No. 17/814,207.
U.S. Final Office Action dated Nov. 30, 2022 in U.S. Appl. No. 16/764,812.
U.S. Final office Action dated Sep. 14, 2023 in U.S. Appl. No. 17/662,220.
U.S. Non Final Office Action dated Mar. 21, 2022, in U.S. Appl. No. 17/250,452.
U.S. Non-Final Office Action dated Aug. 29, 2023, in U.S. Appl. No. 17/310,293.
U.S. Non-Final Office Action dated Dec. 15, 2021 in U.S. Appl. No. 17/250,014.
U.S. Non-Final Office Action dated Feb. 2, 2023 in U.S. Appl. No. 17/589,416.
U.S. Non-Final Office Action dated Feb. 2, 2023 in U.S. Appl. No. 17/662,220.
U.S. Non-Final Office Action dated Feb. 29, 2024 in U.S. Appl. No. 17/294,378.
U.S. Non-Final Office Action dated Jan. 17, 2024 in U.S. Appl. No. 17/814,207.
U.S. Non-Final Office Action dated Jul. 20, 2023, in U.S. Appl. No. 17/814,209.
U.S. Non-Final Office Action dated Jun. 20, 2023, in U.S. Appl. No. 17/250,452.
U.S. Non-Final Office Action dated Jun. 21, 2024 in U.S. Appl. No. 17/639,846.
U.S. Non-Final Office Action dated Jun. 21, 2024 in U.S. Appl. No. 18/379,397.
U.S. Non-Final Office Action dated Jun. 24, 2022, in U.S. Appl. No. 17/436,944.
U.S. Non-Final Office Action dated May 16, 2022 in U.S. Appl. No. 16/764,812.
U.S. Non-Final Office Action dated May 23, 2024 in U.S. Appl. No. 17/662,220.
U.S. Non-Final Office Action dated Nov. 6, 2023, in U.S. Appl. No. 17/814,206.
U.S. Non-Final Office Action dated Nov. 19, 2021, in U.S. Appl. No. 17/250,452.
U.S. Non-Final Office Action dated Nov. 30, 2022 in U.S. Appl. No. 17/814,207.
U.S. Non-Final Office Action dated Nov. 30, 2023 in U.S. Appl. No. 17/250,452.
U.S. Non-Final Office Action dated Oct. 26, 2023, in U.S. Appl. No. 17/589,416.
U.S. Notice of Allowance dated Apr. 4, 2024 in U.S. Appl. No. 17/310,293.
U.S. Notice of Allowance dated Aug. 3, 2023, in U.S. Appl. No. 17/436,944.
U.S. Notice of Allowance dated Feb. 2, 2022 in U.S. Appl. No. 16/724,231.
U.S. Notice of Allowance dated Jan. 2, 2024 in U.S. Appl. No. 17/310,293.
U.S. Notice of Allowance dated Jul. 14, 2023 in U.S. Appl. No. 17/436,944.
U.S. Notice of Allowance dated Jun. 7, 2022 in U.S. Appl. No. 17/250,014.
U.S. Notice of Allowance dated Mar. 27, 2024 in U.S. Appl. No. 17/814,209.
U.S. Notice of Allowance dated Nov. 14, 2023 in U.S. Appl. No. 17/814,209.
U.S. Notice of Allowance dated Oct. 4, 2023, in U.S. Appl. No. 17/436,944.
U.S. Notice of Allowance dated Sep. 16, 2022 in U.S. Appl. No. 17/250,014.
US Notice of allowance dated Sep. 29, 2021 issued in U.S. Appl. No. 16/724,231.
US Office Action dated Sep. 22, 2020 issued in U.S. Appl. No. 16/724,231.
US Office Action Restriction/Election dated Sep. 9, 2021 issued in U.S. Appl. No. 17/250,014.
U.S. Appl. No. 62/362,582, inventors Meng et al., filed Jul. 14, 2016.
U.S. Restriction requirement dated May 13, 2024, in U.S. Appl. No. 18/310,523.
U.S. Supplemental Notice of Allowance dated Dec. 14, 2022 in U.S. Appl. No. 17/250,014.
Werndrup P., et al., A Single-source-precursor Approach to Late Transition Metal Molybdate Materials: the Structural Role of Chelating Ligands in the Formation of Heterometallic Heteroleptic Alkoxide Complexes,European Journal of Inorganic Chemistry, 2006, vol. 2006 (7), 1413-1422.
Zhao, Y., et al., "Synthesis and Structures of Mono- and Dinuclear Molybdenum Complexes with Reduced $\alpha$-Diimine Ligands," European Journal of Inorganic Chemistry, 2016, pp. 5411-5417.
CN Office Action dated Jan. 20, 2026 in CN Application No. 202080072306.1, with English Translation.
CN Office Action dated Jan. 21, 2026 in CN Application No. 202080062173.X, with English Translation.
Hartley, F. R., "Elements of Organometallic Chemistry," The Chemical Society, Monographs for Teachers 26, 1974, pp. 58-59 with English translation; 7 pages.
International Preliminary Report on Patentability and Written Opinion dated Oct. 23, 2025 in PCT Application No. PCT/US2024/023361.
JP Office Action dated Dec. 2, 2025 in JP Application No. 2023-539751, with English Translation.
JP Office Action dated Jan. 6, 2026 in JP Application No. 2023568487, with English Translation.
JP Office Action dated Mar. 19, 2024 in JP Application No. 2021-552861 with English translation.
JP Office Action dated Nov. 4, 2025 in JP Application No. 2023-528357, with English Translation.
JP Office Action dated Sep. 2, 2025 in JP Application No. 2020-561743, with English Translation.
JP Office Action dated Sep. 9, 2025 in JP Application No. 2022-571128, with English Translation.
JP Office Action dated Sep. 16, 2025 in JP Application No. 2024-114404, with English Translation.
Keyan Z., "Essays on Organic Chemistry: Homogeneous Catalytic Reaction of Unsaturated Hydrocarbons," Higher Education Press, May 1989, vol. 3, p. 11 with English translation; 6 Pages.
KR Decision to Grant and Search Report dated Aug. 26, 2025 in KR Application No. 10-2021-7032632, with English translation.
KR Decision to Grant and Search Report dated Dec. 24, 2025 in KR Application No. 10-2022-7011026, with English translation.
KR Decision to Grant and Search Report dated Oct. 24, 2025 in KR Application No. 10-2022-7009362, with English translation.
KR Office Action dated Aug. 26, 2025 in KR Application No. 10-2021-7005949, with English Translation.
KR Office Action dated Dec. 16, 2025 in KR Application No. 10-2022-7044688, with English Translation.
KR Office Action dated Dec. 18, 2025 in KR Application No. 10-2021-7026960, with English Translation.
KR Office Action dated Dec. 29, 2025 in KR Application No. 10-2020-7017697, with English Translation.
KR Office Action dated Oct. 20, 2025 in KR Application No. 10-2022-7044687, with English Translation.

(56) References Cited

OTHER PUBLICATIONS

KR Office Action dated Sep. 16, 2025 in KR Application No. 10-2022-7015736, with English Translation.
KR Office Action dated Sep. 23, 2025 in KR Application No. 10-2022-7044028, with English Translation.
TW Office Action and Search Report dated Aug. 28, 2025 in TW Application No. 111113974, with English Translation.
TW Office Action and Search Report dated Sep. 15, 2025 in TW Application No. 111106158, with English Translation.
U.S. Corrected Notice of Allowance dated Jan. 9, 2026 in U.S. Appl. No. 18/547,481.
U.S. Final Office Action dated Aug. 29, 2025 in U.S. Appl. No. 18/799,905.
U.S. Final Office Action dated Dec. 9, 2025 in U.S. Appl. No. 17/999,255.
U.S. Final Office Action dated Oct. 7, 2025 in U.S. Appl. No. 18/379,397.
U.S. Final Office Action dated Sep. 2, 2025 in U.S. Appl. No. 18/286,994.
U.S. Non-Final Office Action dated Aug. 27, 2025 in U.S. Appl. No. 18/253,038.
U.S. Notice of Allowance dated Dec. 4, 2025 in U.S. Appl. No. 18/286,994.
U.S. Notice of Allowance dated Dec. 12, 2025 in U.S. Appl. No. 18/547,481.
U.S. Notice of Allowance dated Nov. 18, 2025 in U.S. Appl. No. 18/559,783.
U.S. Restriction requirement dated Dec. 23, 2025, in U.S. Appl. No. 18/837,560.
International Preliminary Report on Patentability and Written Opinion dated Jan. 29, 2026 in PCT Application No. PCT/US2024/037234.
CN Office Action dated Jan. 30, 2026 in CN Application No. 202310720841.9, with English Translation.
TW Office Action dated Feb. 4, 2026 in TW Application No. 113149595, with English Translation.
JP Decision to Grant and Search Report dated Feb. 24, 2026 in JP Application No. 2025-239373, with English translation.
JP Decision to Grant and Search Report dated Mar. 3, 2026 in JP Application No. 2025239372, with English translation.
JP Office Action dated Feb. 24, 2026 in JP Application No. 2025-186014, with English Translation.
KR Office Action dated Mar. 18, 2026 in KR Application No. 10-2025-7040894, with English Translation.
KR Office Action dated Mar. 18, 2026 in KR Application No. 10-2025-7040898, with English Translation.
KR Office Action dated Mar. 18, 2026 in KR Application No. 10-2025-7040902, with English Translation.
KR Office Action dated May 13, 2026 in KR Application No. 10-2026-7007391, with English Translation.
CN Office Action dated Mar. 27, 2026 in CN Application No. 202080072306.1, with English Translation.
EP Extended European Search report dated Apr. 8, 2026 in EP Application No. 22908567.5.
EP Extended European Search report dated Apr. 20, 2026 in EP Application No. 23799823.2.
EP Extended European Search report dated Apr. 22, 2026 in EP Application No. 23792451.9.
EP Extended European Search report dated Mar. 27, 2026 in EP Application No. 23797139.5.
EP Extended European Search report dated Mar. 30, 2026 in EP Application No. 23760828.6.
EP Extended European Search report dated May 6, 2026 in EP Application No. 22908571.7.
EP Partial Supplementary European Search report dated Mar. 24, 2026, in EP Application No. 23785342.9.
JP Notice of Allowance dated Apr. 28, 2026 in JP Application No. 2020-561743, with English Translation.
JP Office Action dated Apr. 14, 2026 in JP Application No. 2025-167025, with English Translation.
JP Office Action dated Mar. 3, 2026 in JP Application No. 2023-562824, with English Translation.
JP Office Action dated Mar. 3, 2026 in JP Application No. 2025-028742, with English Translation.
JP Office Action dated Mar. 17, 2026 in JP Application No. 2024-180526, with English Translation.
JP Office Action dated Mar. 24, 2026 in JP Application No. 2024-114404, with English Translation.
JP Office Action dated Mar. 31, 2026 in JP Application No. 2022-522581, with English Translation.
KR Office Action dated Feb. 23, 2026 in KR Application No. 10-2025-7024515, with English Translation.
TW Office Action and Search Report dated Apr. 1, 2026 in TW Application No. 111147088, with English Translation.
TW Office Action and Search Report dated Apr. 17, 2026 in TW Application No. 111147082, with English Translation.
TW Office Action dated Apr. 14, 2026 in TW Application No. 111100209, with English Translation.
TW Office Action dated Mar. 4, 2026 in TW Application No. 113141417, with English Translation.
TW Office Action dated Mar. 31, 2026 in TW Application No. 115102023, with English Translation.
U.S. Final Office Action dated Mar. 23, 2026 in U.S. Appl. No. 18/253,038.
U.S. Non-Final Office Action dated Apr. 6, 2026 in U.S. Appl. No. 18/877,501.
U.S. Non-Final Office Action dated Apr. 27, 2026 in U.S. Appl. No. 17/999,255.
U.S. Non-Final Office Action dated Apr. 29, 2026 in U.S. Appl. No. 19/124,236.
U.S. Non-Final Office Action dated Feb. 24, 2026 in U.S. Appl. No. 18/379,397.
U.S. Non-Final Office Action dated Mar. 19, 2026 in U.S. Appl. No. 18/837,560.
U.S. Non-Final Office Action dated May 8, 2026 in U.S. Appl. No. 18/258,973.
U.S. Notice of Allowance dated Apr. 16, 2026 in U.S. Appl. No. 17/753,042.
U.S. Appl. No. 19/550,133, inventors Thombare S.V et al., filed on Feb. 25, 2026.
U.S. Appl. No. 19/567,111, inventors Schloss L et al., filed on Mar. 14, 2026.
Bivour M., et al., "Atomic Layer Deposited Molybdenum Oxide for the Hole-selective Contact of Silicon Solar Cells," Energy Procedia, 2016, vol. 92, pp. 443-449.
CN Office Action dated Apr. 18, 2025 in CN Application No. 202310720841.9, with English Translation.
CN Office Action dated Apr. 24, 2025 in CN Application No. 202210124989.1, with English Translation.
CN Office Action dated Jan. 7, 2026 in CN Application No. 202210124989.1, with English Translation.
CN Office Action dated Jun. 19, 2026 in CN Application No. 202310720841.9, with English Translation.
CN Office Action dated Mar. 31, 2023 in Application No. CN201880049228.6 with English translation.
CN Office Action dated May 28, 2026 in CN Application No. 202080062173.X, with English Translation.
EP Extended European Search report dated Jun. 16, 2026 in EP Application No. 23785342.9.
EP Extended European Search report dated Jun. 17, 2026 in EP Application No. 23828096.0 .
International Search Report and Written Opinion dated Mar. 18, 2025 in PCT Application No. PCT/US2024/059324.
International Search Report and Written Opinion dated Sep. 1, 2025 in PCT Application No. PCT/US2025/030255.
JP Office Action dated Dec 2, 2025 in JP Application No. 2024-190197, with English Translation.
JP Office Action dated Dec 2, 2025 in JP Application No. 2024-197799, with English Translation.
JP Office Action dated Jul. 30, 2024 in JP Application No. 2024-74582, with English Translation.
JP Office Action dated Jun. 16, 2026 in JP Application No. 2025-084496, with English Translation.

(56) References Cited

OTHER PUBLICATIONS

JP Office Action dated Jun. 16, 2026 in JP Application No. 2025-186014, with English Translation.
JP Office Action dated Jun. 16, 2026 in JP Application No. 2026-38898, with English Translation.
JP Office Action dated Jun. 2, 2026 in JP Application No. 2023-528357, with English translation.
JP Office Action dated Jun. 9, 2026 in JP Application No. 2023568487, with English translation.
JP Office Action dated Oct. 28, 2025 in JP Application No. 2024-180526, with English Translation.
Kim H., et al., "Plasma-enhanced Atomic Layer Deposition of Tantalum Thin Films: the Growth and Film Properties," Thin Solid Films, 2003, vol. 441, pp. 311-316.
KR Office Action dated Aug. 26, 2025 in KR Application No. 10-2022-7031123, with English Translation.
KR Office Action dated Jan. 10, 2025 in KR Application No. 10-2022-7033814 with English Translation.
KR Office Action dated Jun. 12, 2023, in Application No. KR10-2020-7000198 with English Translation.
KR Office Action dated Jun. 18, 2026 in KR Application No. 10-2022-7044028, with English Translation.
KR Office Action dated Jun. 19, 2026 in KR Application No. 10-2021-7005949, with English Translation.
KR Office Action dated May 18, 2026 in KR Application No. 10-2022-7045707, with English Translation.
KR Office Action dated May 27, 2026 in KR Application No. 10-2024-7023348, with English Translation.
KR Office Action dated Nov. 21, 2024 in KR Application No. 10-2022-7031123, with English Translation.
KR Office Action dated Oct. 23, 2025 in KR Application No. 10-2022-7033814, with English Translation.
KR Office Action dated Oct. 27, 2025 in KR Application No. 10-2024-7039621, with English Translation.
Kvalvik J N., et al., "Area-Selective Atomic Layer Deposition of Molybdenum Oxide," JVSTA, Jul. 2020, vol. 38 (4), pp. 1-9.
Leick, N., et al., "Dehydrogenation Reactions During Atomic Layer Deposition of Ru Using O2, "Chemistry of Materials, 2012, vol. 24, pp. 3696-3700.
Lindermann H M., et al., "Selective Oxide (SelOx) Deposition as Unique Gap Fill Solution for Shallow Trench Isolation," IEEE, 2007, pp. 253-258.
Rabdo S.A., et al., "Synthesis and Physical-chemical Studies of Molybdenum(v) Fluorohalidenedes," Journal of Inorganic Chemistry, 1992, vol. 37, pp. 1-15.
Rabov S.A., et al., "Fluorochlorides of Molybdenum(V)," Journal of Inorganic Chemistry, 1985, vol. 30 (7), pp. 1-7.
Seo S., et al., "The Precursor Adsorption Mechanism, Growth Characteristics and Electrical Properties of Plasma- Enhanced Atomic Layer Deposited Tungsten Films by Using Tungsten Chloride Precursors," IEEE International Interconnect Technology Conference (IITC), 2020, pp. 103-105.
SG Search Report and Written Opinion dated May 19, 2026 in SG Application No. 11202261355S.
Tan K.C., et al., "Utilizing Tertiary Butyl lodide As an Effective Film Quality Enhancing Agent for Atomic Layer Deposition of HfO2 Dielectric Thin Films", AIP Advances, 2021, vol. 11 (7), pp. 1-6.
TW Notice of Allowance and Search Report dated Oct. 9, 2025 in TW Application No. 113100708, with English translation.
TW Office Action and Search Report dated Aug. 6, 2025 in TW Application No. 113141417, with English Translation.
TW Office Action and Search Report dated Jan. 6, 2025 in TW Application No. 113130606, with English Translation.
TW Office Action and Search Report dated May 28, 2026 in TW Application No. 112114336, with English Translation.
TW Office Action dated Jul. 1, 2024 in TW Application No. 113116290 with English translation.
TW Office Action dated Oct. 3, 2025 in TW Application No. 113130606, with English Translation.
TW Office Action dated Oct. 4, 2024 in TW Application No. 113100708 with English translation.
TW Office Action dated Oct. 14, 2024 in TW Application No. 113116290 with English translation.
U.S. Appl. No. 19/473,869, inventors Mandia D.J et al., filed on Oct. 9, 2025.
U.S. Appl. No. 19/500,039, inventors Mandia D.J et al., filed on Jan. 7, 2026.
U.S. Appl. No. 19/596,594, inventors Kelkar S.S, et al., filed on Jun. 12, 2026.

* cited by examiner

DEPOSITION OF METAL FILMS

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

BACKGROUND

Tungsten (W) film deposition using chemical vapor deposition (CVD) techniques is an integral part of semiconductor fabrication processes. For example, tungsten films may be used as low resistivity electrical connections in the form of horizontal interconnects, vias between adjacent metal layers, and contacts between a first metal layer and the devices on a silicon substrate. Tungsten films may also be used in various memory applications, including in formation of buried wordline (bWL) architectures for dynamic random access memory (DRAM), word lines for 3D NAND, and logic applications. However, the continued decrease in feature size and film thickness brings various challenges including high resistivity for thinner films. Other metals such as molybdenum (Mo) are being evaluated as low resistivity replacements for W.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

One aspect of the disclosure relates to method of depositing metal. It includes depositing a first layer from a metal oxychloride precursor and ammonia using a first atomic layer deposition (ALD) process. It also includes depositing an elemental metal layer on the first layer from a metal oxychloride precursor and hydrogen using a second ALD process.

Implementations may include one or more of the following features. The method where the first layer is a metal oxynitride or metal nitride layer. The method where the first layer is converted to an elemental metal layer during or prior to the second ALD process. The method where the converted elemental metal later contains less than 1 (atomic) % impurities. The method where the first layer is an amorphous layer. The method where the elemental layer is crystalline. The method where the first and second ALD processes are performed in the same chamber and without exposure to air. The method where the first layer is a template for metal grain growth in the second layer. The method where the elemental layer contains less than 1 (atomic) % impurities. The method where the elemental metal layer is elemental tungsten. The method where the elemental metal layer is elemental molybdenum. The method where the first layer is one of molybdenum oxynitride and molybdenum nitride. The method where the first ALD process is performed at a temperature less than 400° C.

The method where the second ALD process is performed at a temperature greater than 400° C. The method where deposition of the first layer and deposition of the elemental layer are performed in the same chamber. The method where deposition of the first layer and deposition of the elemental layer are performed in different stations of the same chamber. The method where deposition of the first layer is performed in a first chamber and deposition of the elemental layer is performed in a second chamber. The method further including exposing the first layer to a prior to deposition of the elemental layer.

Another aspect of the disclosure includes relates to an apparatus including: first and second process chambers each configured to house a substrate, a substrate support in each of the process chambers, gas inlets configured to direct gas into each of the process chambers, a heater configured to heat the substrate support in each process chamber, and a controller including program instructions for: The apparatus also includes sequentially inletting a metal oxychloride precursor and ammonia into the first process chamber while a substrate is housed in the first process chamber. The apparatus also includes after (a), transfer the substrate to the second process chamber. The apparatus also includes after (b), sequentially inletting a metal oxychloride precursor and hydrogen into the second process chamber while the substrate is housed in the second process chamber.

Another aspect of the disclosure relates to an apparatus including: a process chamber having one or more stations, each configured to house a substrate; a substrate support in each of the one or more stations; gas inlets configured to direct gas into each of the one or more stations; a heater configured to heat the substrate support in each station; and a controller including program instructions for: sequentially inletting a metal oxychloride precursor and ammonia into one of the one or stations; and sequentially inletting a metal oxychloride precursor and hydrogen into one of the one or stations.

These and other aspects are described more fully below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Provided herein are low resistance metallization stack structures for logic and memory applications and related methods of fabrication. In some embodiments, thin metal oxynitride or metal nitride nucleation layers are deposited followed by deposition of a pure metal conductor. The nucleation layer is amorphous, which templates large pure metal film grain growth and reduced resistivity. Further, certain embodiments of the methods described below convert most or all of the metal oxynitride nucleation layer to a pure metal layer, further lowering the resistivity.

According to various embodiments, one or more advantages may be realized. In some embodiments, deposition of metals such as Mo directly on aluminum oxide and other dielectrics may be performed. In some embodiments, these depositions may be performed at temperatures less than 500° C. or even lower than 400° C. without significant nucleation delay. Deposition at low temperatures can result in better step coverage. In various embodiments, lower resistivity films may be obtained from large grain size of the films and/or because the films may be deposited directly on dielectrics without high resistivity films such as titanium nitride (TiN). Addition of a low-temperature metal-nitride nucleation layer can enable subsequent pure metal deposition at temperatures less than 600° C. or even less than 500° C. This can make the metal (nitride)+pure-metal nucleation stack suitable for semiconductor applications that have thermal budgets of less than 600° C. or 500° C. for wafer processing. This enables deposition of metals without a high resistivity layer such as TiN and at temperatures inaccessible for pure films; for example, temperatures for pure Mo ALD can exceed 600° C. when deposited directly on dielectrics.

Figure 1A:
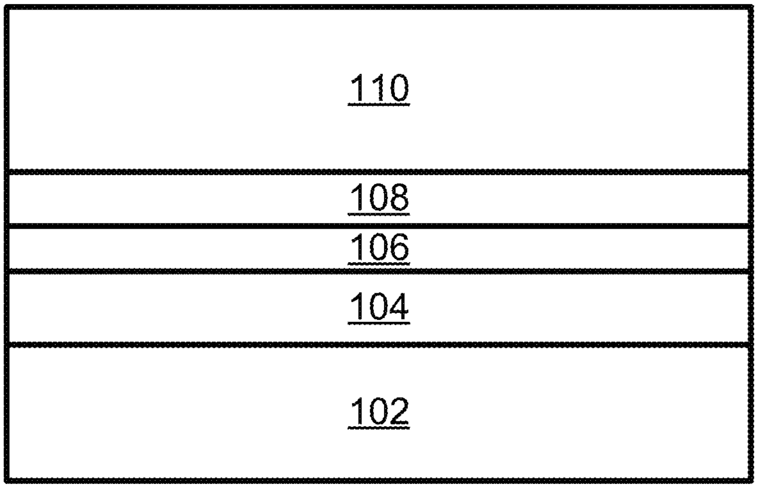
FIGS. 1A and 1B are schematic examples of material stacks that include a nucleation layer as a template for metal growth.
Figure 1B:
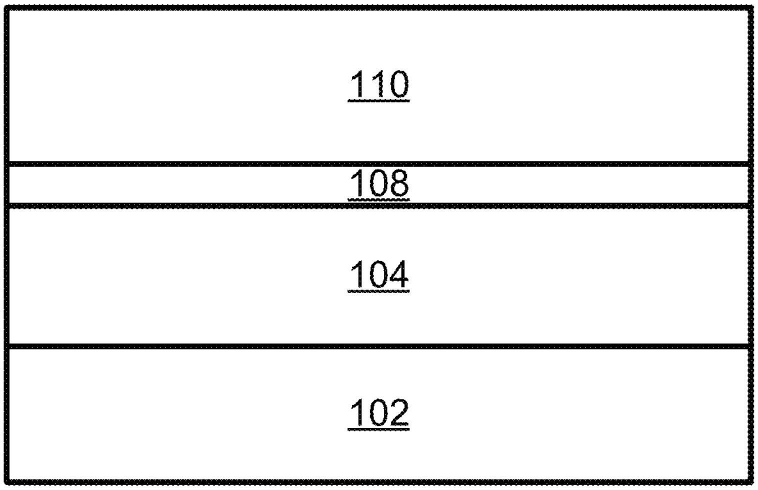

FIGS. 1A and 1B are schematic examples of material stacks that include a nucleation layer as a template for metal growth. FIGS. 1A and 1B illustrate the order of materials in a particular stack and may be used with any appropriate architecture and application, as described further below with respect to FIGS. 2, 3A, and 3B. In the example of FIG. 1A, a substrate 102 has a nucleation layer 108 deposited thereon. The substrate 102 may be a silicon or other semiconductor wafer, e.g., a 200-mm wafer, a 300-mm wafer, or a 450-mm wafer, including wafers having one or more layers of material, such as dielectric, conducting, or semi-conducting material deposited thereon. The methods may also be applied to form metallization stack structures on other substrates, such as glass, plastic, and the like.

In FIG. 1A, a dielectric layer 104 is on the substrate 102. The dielectric layer 104 may be deposited directly on a semiconductor (e.g., Si) surface of the substrate 102, or there may be any number of intervening layers. Examples of dielectric layers include doped and undoped silicon oxide, silicon nitride, and aluminum oxide layers, with specific examples including doped or undoped layers $SiO_2$ and $Al_2O_3$. Also, in FIG. 1A, a diffusion barrier layer 106 is disposed between the nucleation layer 108 and the dielectric layer 104. Examples of diffusion barrier layers including titanium nitride (TiN), titanium/titanium nitride (Ti/TiN), tungsten nitride (WN), and tungsten carbon nitride (WCN). A metal layer 110 is deposited on the nucleation layer 108 and is the main conductor (also referred to as a bulk conductor or bulk layer) of the structure with the nucleation layer 108 providing a template for metal growth.

As described further below, the nucleation layer 108 is deposited as an amorphous film. By using an amorphous film, which has large grains, as a template for metal growth, metal having large grains and low resistivity can be formed. Examples of metal layers include tungsten (W) and molybdenum (Mo) layers.

FIG. 1B shows another example of a material stack. In this example, the stack includes the substrate 102, dielectric layer 104, with the nucleation layer 108 deposited directly on the dielectric layer 104, without an intervening diffusion barrier layer. As in the example of FIG. 1A, a metal layer 110 is deposited on the nucleation layer 108 and is the main conductor of the structure.

In the examples of FIGS. 1A and 1B, the nucleation layer 108 may be deposited a metal oxynitride layer, e.g., a tungsten oxynitride or molybdenum oxynitride layer. However, during subsequent processing, in certain embodiments, all or most of the nucleation layer 108 may be converted to a pure metal. Accordingly, according to various embodiments, the nucleation layer 108 may or may not be the same composition as the pure metal layer 110. The nucleation layer 108 may be characterized by its amorphous character, with the pure metal layer 110 characterized by its large grain size.

In some embodiments, the metal of the metal oxynitride layer is the same as that of the pure metal conductor, e.g., a molybdenum oxynitride layer may be deposited as a nucleation layer prior to deposition of a molybdenum layer or a tungsten oxynitride layer may be deposited as a nucleation layer prior to deposition of a tungsten layer. In other embodiments, the metal oxynitride layer may have a different metal than that of the pure conductor, e.g., a tungsten layer may be deposited on a molybdenum-containing nucleation layer or a molybdenum layer may be deposited on a tungsten-containing nucleation layer.

While FIGS. 1A and 1B show examples of metallization stacks, the methods and resulting stacks are not so limited. For example, in some embodiments, the nucleation layer may be deposited directly on a Si or other semiconductor substrate as a template for metal growth. Further, while tungsten (W) or molybdenum (Mo) growth on the nucleation layers is described above, the nucleation layers may be serve as a template for low resistivity growth of other metals cobalt (Co), ruthenium (Ru), nickel (Ni), and alloys including these metals such as MoW. Still further, the nucleation layer may be any appropriate metal oxynitride or metal nitride layer, including molybdenum oxynitride, molybdenum nitride, tungsten oxynitride, tungsten nitride, nickel nitride, etc.

Figure 2:
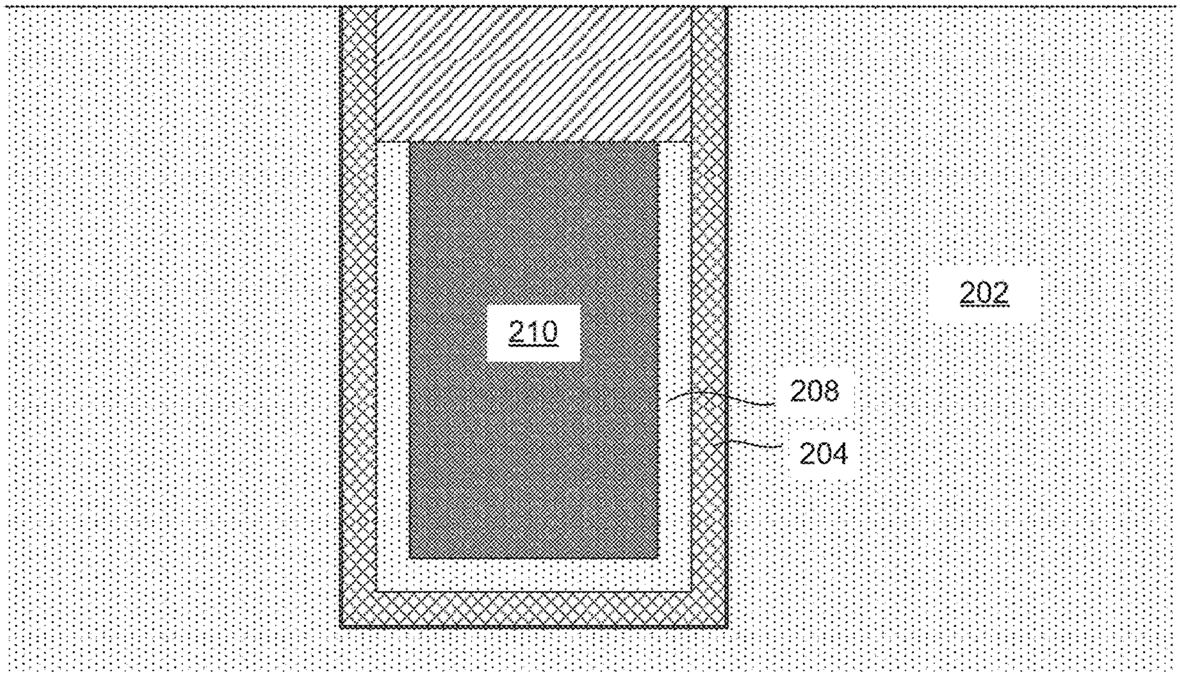
FIGS. 2, 3A, and 3B provide examples of structures in which the material stacks may be employed according to various embodiments.
Figure 3A:
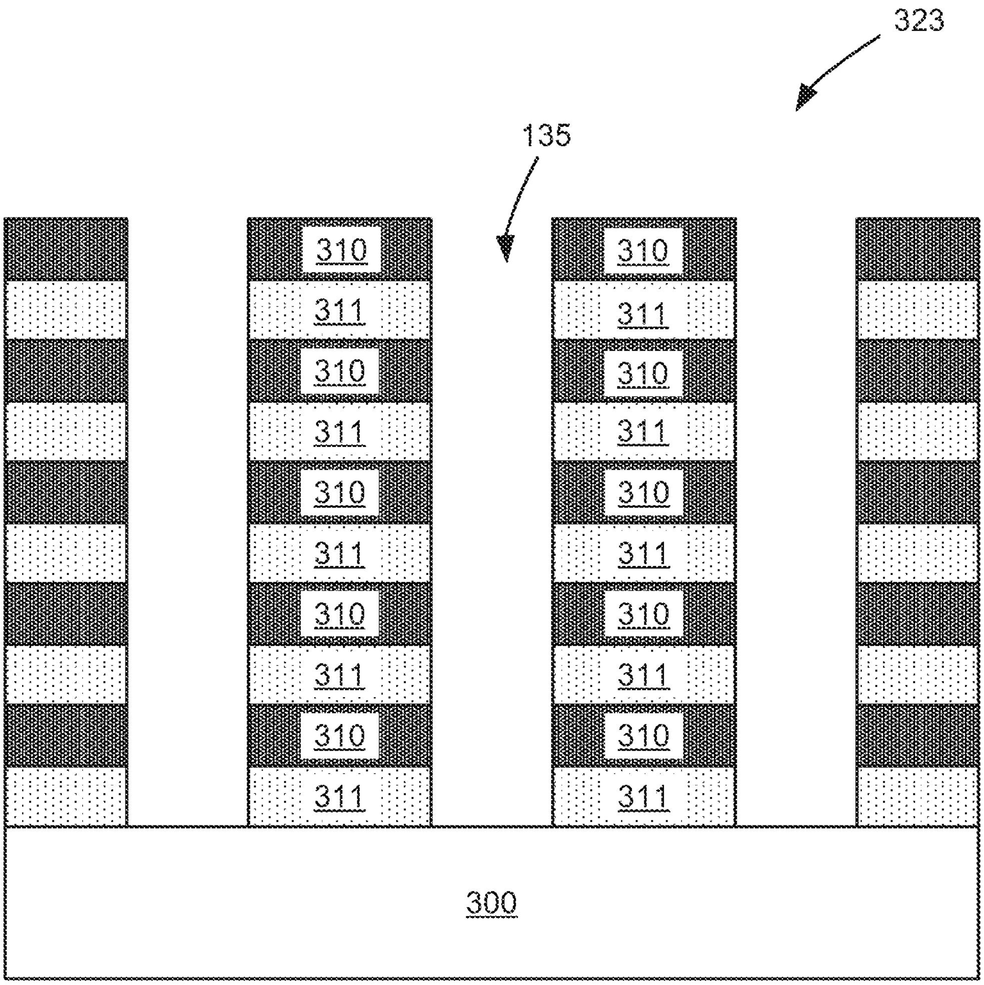
Figure 3B:
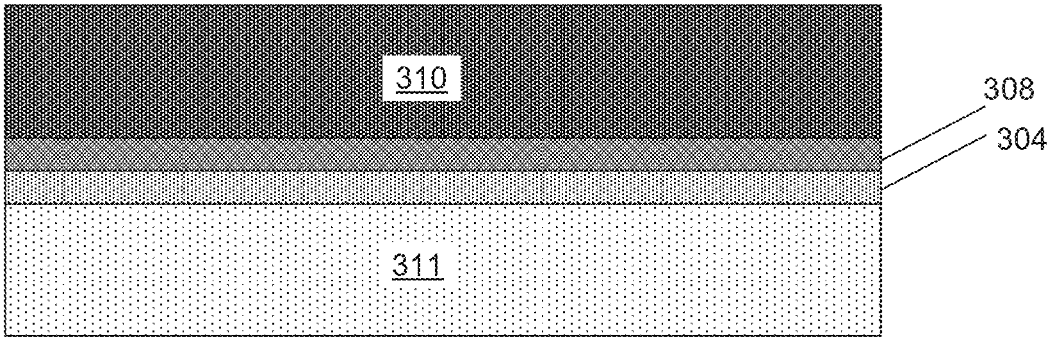

The material stacks described above and further below may be implemented in a variety of structures. FIGS. 2, 3A, and 3B provide examples of structures in which the stacks may be employed. FIG. 2 depicts a schematic example of a DRAM architecture including a buried wordline (bWL) 210 in a silicon substrate 202. The bWL 210 is formed in a trench etched in the silicon substrate 202. Lining the trench is a conformal nucleation layer 208 and an insulating layer 204 that is disposed between the conformal nucleation layer 208 and the silicon substrate 202. In the example of FIG. 2, the insulating layer 204 may be a gate oxide layer, formed from a high-k dielectric material such as a silicon oxide or silicon nitride material. In some embodiments, a conformal barrier layer such as TiN or a tungsten-containing layer may be interposed between the nucleation layer 208 and the insulating layer 204.

FIG. 3A depicts a schematic example of wordlines 310 in a 3D NAND structure 323. The wordlines 310 are separated by oxide layers 311. In FIG. 3B, a detail of the interface between a wordline 310 and oxide layer 311 is shown including a layer of aluminum oxide ($Al_2O_3$) 304 and a nucleation layer 308 is shown. In some embodiments, the nucleation layer 308 may be deposited directly on the oxide layer 311 or on a TiN or other barrier layer as described herein. The nucleation layers may be between about 10 Å and 100 Å, or 10 Å and 50 Å, for example, for deposition of a wordline 310 of between about 10 nm and 100 nm thick.

Figure 4:
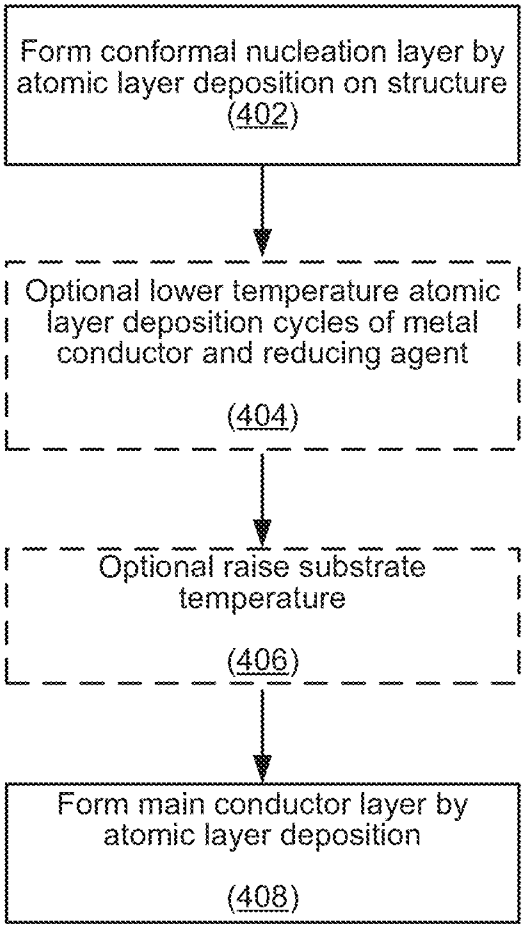
FIG. 4 is a process flow diagram illustrating operations in a method of depositing a conductive material according to various embodiments.

FIG. 4 is a process flow diagram illustrating operations in a method of depositing a conductive material. In operation 402, a conformal nucleation layer is formed on a structure by an atomic layer deposition (ALD). In an ALD method, the substrate may be exposed in cycles such that the substrate is first exposed to a pulse of a suitable metal-containing precursor, then the precursor is optionally purged, then the substrate is exposed to a pulse of a reducing agent, and then the reducing agent is optionally purged, and such cycles may be repeated until a desired thickness of the nucleation layer is formed on the substrate. It will be appreciated that the order of precursor and reducing agent may be reversed such that the sequence may be initiated by a reducing agent dose followed by a metal containing precursor dose.

In some embodiments, the reducing agent is ammonia ($NH_3$) or other nitrogen-containing reducing agent such hydrazine ($N_2H_4$). $NH_3$ chemisorption on dielectrics is more favorable than that of hydrogen ($H_2$). In some embodiments, the reducing agent and precursor are selected such that they react without reducing agent dissociation. $NH_3$ reacts with metal oxychlorides and metal chlorides without dissociation. This is in contrast to, for example, ALD from metal oxychlorides that uses $H_2$ as a reducing agent; $H_2$ dissociates on the surface to form adsorbed atomic hydrogen, which results in very low concentrations of reactive species and low surface coverage during initial nucleation of metal on the dielectric surface. By using $NH_3$ and metal oxychloride or metal chloride precursors, nucleation delay is reduced or eliminated at deposition temperatures up to hundreds of degrees lower than used by $H_2$ reduction of the same metal precursors.

In some embodiments, the reducing agent may be a boron-containing or silicon-containing reducing agent such as diborane ($B_2H_6$) or ($SiH_4$). These reducing agents may be used with metal chloride precursors; with metal oxychlorides, however, the $B_2H_6$ and $SiH_4$ will react with water formed as a byproduct during the ALD process and form solid $B_2O_3$ and $SiO_2$, which are insulating and will remain in the film, increasing resistivity. Use of $NH_3$ also has improved adhesion over $B_2H_6$ and $SiH_4$ ALD processes on certain surfaces including $Al_2O_3$.

Examples of metal oxychloride and metal chloride precursors include molybdenum pentachloride ($MoCl_5$), molybdenum oxychlorides such as molybdenum dichloride dioxide ($MoO_2Cl_2$) and molybdenum oxytetrachloride ($MoOCl_4$), tungsten pentachloride ($WCl_5$), tungsten hexachloride ($WCl_6$), tungsten tetrachloride ($WCl_4$), tungsten dichloride ($WCl_2$), and tungsten oxychlorides ($WO_xCl_y$) such as tungsten oxytetrachloride ($WOCl_4$).

The metal chloride and metal oxychloride may be useful in embodiments in which fluorine incorporation is a concern. However, in some embodiments, fluorine-containing precursors may be used. These include metal fluorides such as tungsten hexafluoride ($WF_6$), molybdenum hexafluoride ($MoF_6$), and molybdenum pentafluoride ($MoF_5$).

The resulting nucleation layer is generally not a pure elemental film but a metal nitride or metal oxynitride film. In some embodiments, there may be residual chlorine or fluorine from the deposition, particularly if the deposition is performed at low temperatures. In some embodiments, there no more than a trace amount of residual chlorine or fluorine. In some embodiments, the nucleation layer is an amorphous layer. Impurities in the film (e.g., oxygen, $NH_3$, chlorine or other halogen) facilitate growth of an amorphous microstructure. In some embodiments, the nucleation layer as deposited is an amorphous metal oxynitride layer or an amorphous metal nitride layer. The amorphous character templates large grain growth in the subsequently deposited conductor. The surface energy of nitride or oxynitride relative to an oxide surface is much more favorable than that of a metal on an oxide surface, facilitating formation of a continuous and smooth film on the dielectric. This allows formation of thin, continuous layers. Example thicknesses of the nucleation layer range from 5-30 Å as deposited. Depending on the temperature, this may be about 5-50 ALD cycles for example.

As described below, during subsequent processing the nucleation layer may be converted to a pure (or less impure) elemental metal film with the thickness decreasing.

Substrate temperature for nucleation layer deposition may range, for example, from 300° C.-600° C. In some embodiments, low temperatures may be used. Such temperatures may be less than 500° C., less than 550° C., less than 450° C., less than 400° C., or less than 350° C. Low temperatures may be used for improved step coverage. In addition, low temperatures may increase the amount of impurities in the nucleation layer, increasing the amorphous character, which in turn may increase grain size of the subsequently deposited conductor.

The surface on which the nucleation layer is deposited depends on the particular application. In some embodiments, the nucleation layer is deposited directly on a dielectric (e.g., silicon oxide, aluminum oxide, silicon nitride, etc.) surface. In some embodiments, the nucleation layer is deposited directly on a titanium nitride or other surface. As discussed further below, by performing operation 402, the subsequent elemental metal deposition may be performed on any surface.

After deposition of the nucleation layer, an optional operation 404 may be performed. In operation 404, lower temperature ALD cycles a metal conductor and a reducing agent are performed. The "lower" temperature refers to the temperature in operation 404, if performed, being lower than the subsequent operation 406. Example temperatures may be less than 500° C., less than 550° C., less than 450° C., less than 400° C., or less than 350° C. In this operation, the reducing agent is different than in operation 402, and in particular examples may be hydrogen ($H_2$). In particular, $H_2$ may result in deposition of an elemental film with significantly fewer impurities than in the nucleation layer. The temperature may be the same temperature as used in operation 402 in some embodiments. The metal precursor may also be the same or a different precursor than in employed in operation 402. In some embodiments, the same precursor is used, with only the reducing agent changed. In some embodiments, operation 404 may facilitate conversion of the metal nitride or metal oxynitride nucleation layer to an elemental metal film. According to various embodiments, operation 404 may or may not deposit an appreciable amount of film of the main conductor.

In a further optional operation 406, the substrate temperature is raised. In embodiments, in which operation 404 is performed, operation 406 is also performed. In other embodiments, operation 406 may be performed. For example, if the nucleation layer deposition occurs at relatively low temperatures (e.g., below 400° C.), the temperature may be raised in operation 406 to a higher temperature at which deposition of the main conductor will be performed. In some embodiments, the temperature may be greater than 500° C., and in some embodiments, greater than 600° C. In some embodiments, a lower temperature (e.g., between 400° C. and 500° C., endpoints inclusive) may be used for bulk deposition. The temperature may or may not be raised, depending on the temperature of previous operations.

The method may then proceed to an operation 408 (from any of operation 402, 404, or 406) in which the main conductor is deposited by ALD. As in operation 404 (if performed), $H_2$ may be used as a reducing agent.

Examples of metal oxychloride and metal chloride precursors that may be employed in operations 404 and 408 include molybdenum pentachloride ($MoCl_5$) and molybdenum hexachloride ($MoCl_6$), molybdenum oxychlorides such as molybdenum dichloride dioxide ($MoO_2Cl_2$) and molybdenum oxytetrachloride ($MoOCl_4$), tungsten pentachloride ($WCl_5$), tungsten hexachloride ($WCl_6$), tungsten tetrachloride ($WCl_4$), tungsten dichloride ($WCl_2$), and tungsten oxychlorides ($WO_xCl_y$) such as tungsten oxytetrachloride ($WOCl_4$).

During one or more of operations 404-408, the nucleation layer is converted to an elemental metal layer. This may also be characterized as removing impurities, i.e., any non-metal constituent. The nucleation layer may have greater impurities than the subsequently deposited elemental layer, but they are sufficiently removed such that the stack resistivity is the same or similar to a stack that does not include a nucleation layer. The thickness will also decrease; for example, a 30 Å as-deposited film may contribute about 10 Å metal to the stack.

According to various embodiments, one or more of the following may be employed to facilitate conversion of the nucleation layer to an elemental metal film: 1) depositing the bulk conductor at a higher temperature (e.g., 550° C.) than the nucleation layer is deposited, 2) performing lower temperature ALD $H_2$/metal precursor cycles as described with reference to operation 404 above, and 3) in-situ deposition of the bulk layer, such that the nucleation layer is not exposed to air or otherwise oxidized before bulk deposition. Mo oxychlorides and W oxychlorides in particular are relatively easy to convert to elemental metal. The resulting converted nucleation layer and pure metal layer may each be characterized as having fewer than 1% atomic impurities.

Figure 5:
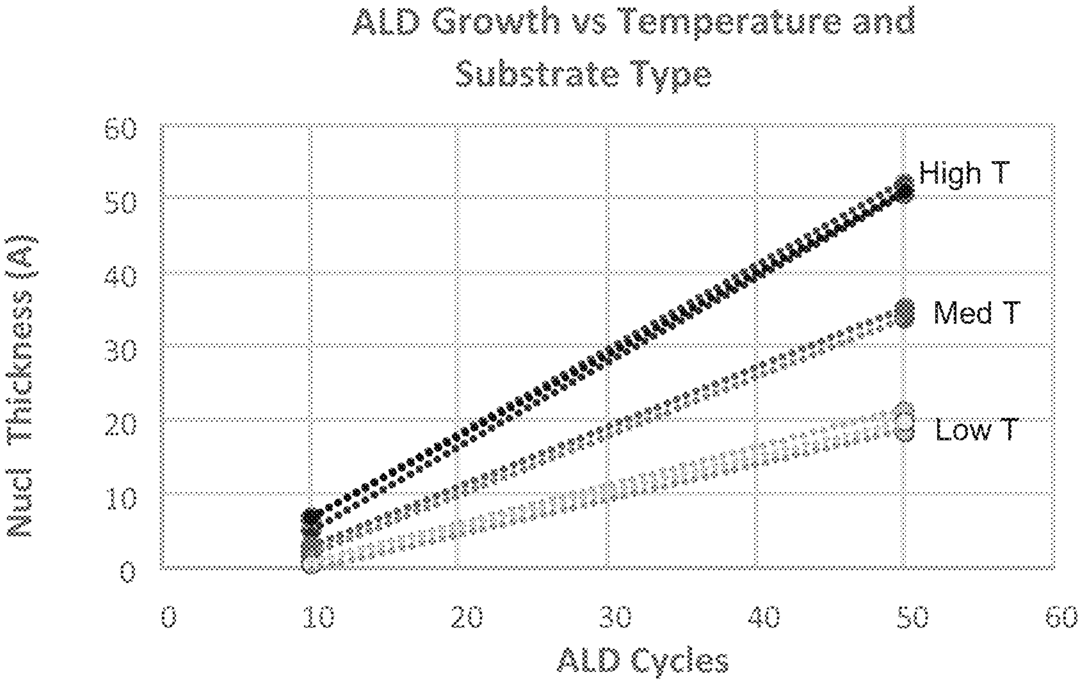
FIG. 5 shows atomic layer deposition growth rate on a dielectric surface of a molybdenum-containing layer using ammonia reducing agent and a molybdenum oxychloride precursor.

FIG. 5 shows results of forming a Mo-containing layer using $NH_3$ a reducing agent and a molybdenum oxychloride precursor to form a nucleation layer, then converting the Mo-containing layer to Mo as described above. FIG. 5 shows the nucleation layer thickness, after conversion to Mo, is shown as a function of ALD cycles. At each temperature (350° C.—low, 400° C.—med, 450° C.—high), deposition was performed on three different surfaces: an $Al_2O_3$ surface, a TiN surface, and a thermal $SiO_2$ surface. At each temperature, the growth rate is the same for all surfaces. Thus, while the growth rate is insensitive to temperature, it is insensitive to substrate surface. Notably, this is different from other deposition systems, which can be highly substrate dependent. For example, an $H_2$ and molybdenum oxychloride ALD deposition would deposit on TiN, deposit a small amount on $SiO_2$, and deposit almost nothing on $Al_2O_3$.

Figure 6:
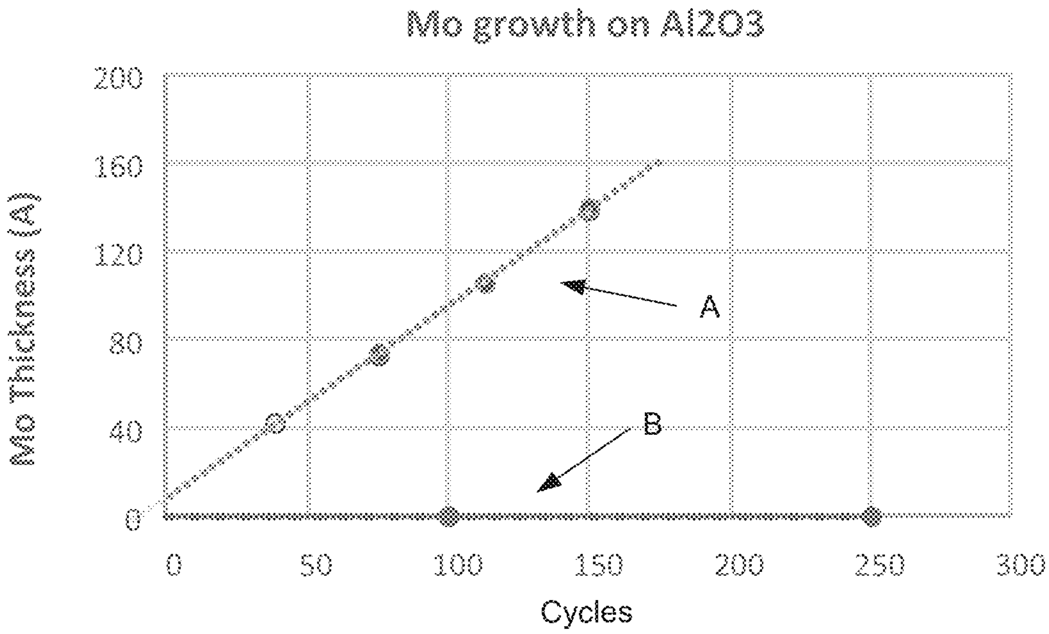
FIG. 6 shows molybdenum growth from hydrogen and a molybdenum oxychloride on a nucleation layer deposited on a dielectric surface as described compared to molybdenum growth from hydrogen and a molybdenum oxychloride directly on a dielectric surface.

FIG. 6 shows subsequent Mo growth from $H_2$ and molybdenum oxychloride ALD cycles on a nucleation layer deposited on an $Al_2O_3$ surface as described above as compared to Mo growth from $H_2$ and molybdenum oxychloride ALD cycles directly on an $Al_2O_3$ surface at 550° C. Curve A shows Mo growth on approximately 10 Å nucleation layer deposited from $NH_3$/Mo oxychloride and curve B shows Mo growth on $Al_2O_3$. As can be seen, ALD deposition from $H_2$ reduction of the Mo precursor shows a steady growth on the Mo nucleation layer deposited from $NH_3$ reduction of the Mo precursor, with no nucleation delay. By contrast, the $H_2$/Mo precursor ALD cycles result in no deposition on $Al_2O_3$.

Figure 7:
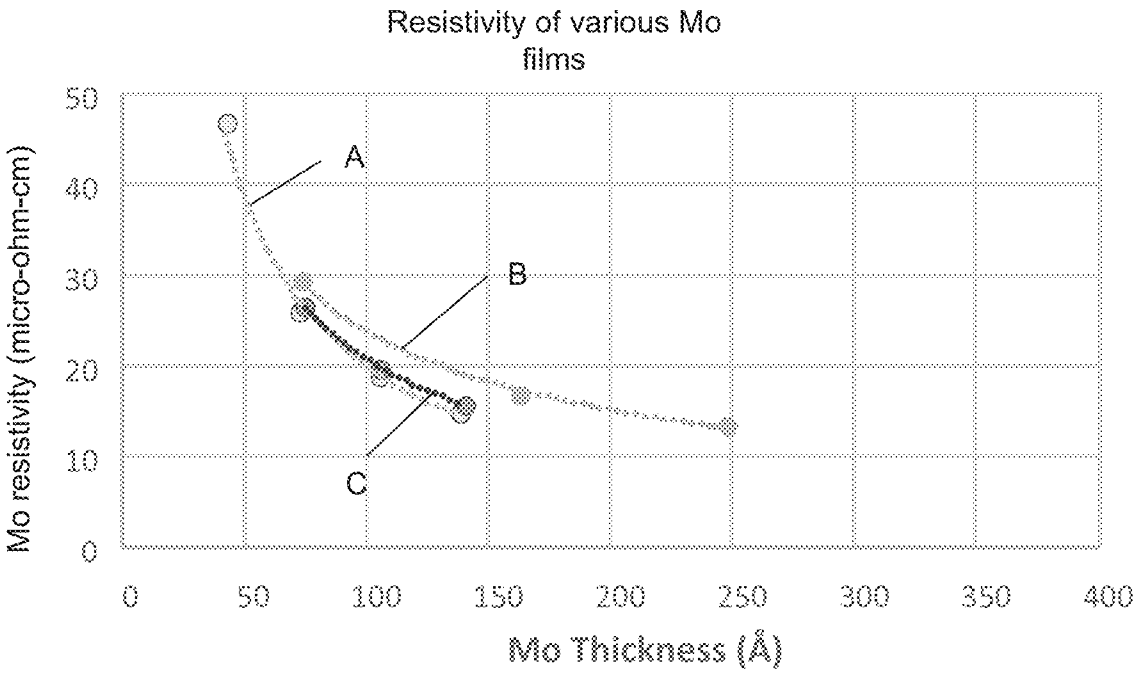
FIG. 7 is a plot showing resistivity of molybdenum films deposited as described herein compared to a molybdenum film deposited on titanium nitride.

FIG. 7 shows resistivity of various Mo films. Curve A represents resistivity of $H_2$/Mo oxychloride ALD film on a low temperature $NH_3$/Mo oxychloride nucleation layer, Curve B represents resistivity of $H_2$/Mo oxychloride ALD film on a high temperature $NH_3$/Mo oxychloride nucleation layer, and Curve C represents resistivity of $H_2$/Mo oxychloride ALD film on TiN. No increase in blanket resistivity is found using the nucleation layers described herein, indicating that they are converted to elemental Mo films.

While the description above refers to metal oxychloride and metal chloride precursors, the methods may also be performed with other halogen containing precursors including metal oxyfluoride and metal fluoride precursors.

In some embodiments, the methods may involve depositing a metal oxynitride or metal nitride nucleation layer followed by deposition of a pure metal layer by chemical vapor deposition (CVD).

Apparatus

Any suitable chamber may be used to implement the disclosed embodiments. Example deposition apparatuses include various systems, e.g., ALTUS® and ALTUS® Max, available from Lam Research Corp., of Fremont, California, or any of a variety of other commercially available processing systems. The process can be performed on multiple deposition stations in parallel.

In some embodiments, a nucleation layer deposition process is performed at a first station that is one of two, five, or even more deposition stations positioned within a single deposition chamber. For example, nucleation layer deposition may be performed at a first station, followed by lower temperature hydrogen reduction of a metal precursor at a second station, followed by high temperature hydrogen reduction of a metal precursor at a third station. Each station may have independent temperature control. In some embodiments, various steps for the process are performed at two different stations of a deposition chamber. For example, the substrate may be exposed to $NH_3$ in a first station using an individual gas supply system that creates a localized atmosphere at the substrate surface, and then the substrate may be transferred to a second station to be exposed to a metal chloride, metal fluoride, or metal oxychloride precursor precursor to deposit the nucleation layer. In some embodiments, the substrate may then be transferred back to the first station for a second exposure of $NH_3$. Then the substrate may be transferred to the second station for exposure to the metal precursor. The substrate may also be exposed to $NH_3$ at another station following the first metal chloride or metal oxychloride deposition. This may be repeated as necessary to complete nucleation layer deposition and proceed with bulk layer deposition in the same or different stations.

In some embodiments, multiple chambers are used to perform the methods described herein. For example, deposition of the nucleation layer may be performed in a first chamber and deposition of the bulk metal layer performed in a second chamber. The two chambers may be connected to a common vacuum chamber such that the substrate can be transferred between them without exposure. In alternate embodiments, the chambers are not connected under vacuum, with the substrate exposed to air during transfer. Any oxidation can be reduced in the subsequent processing as described above.

Figure 8:
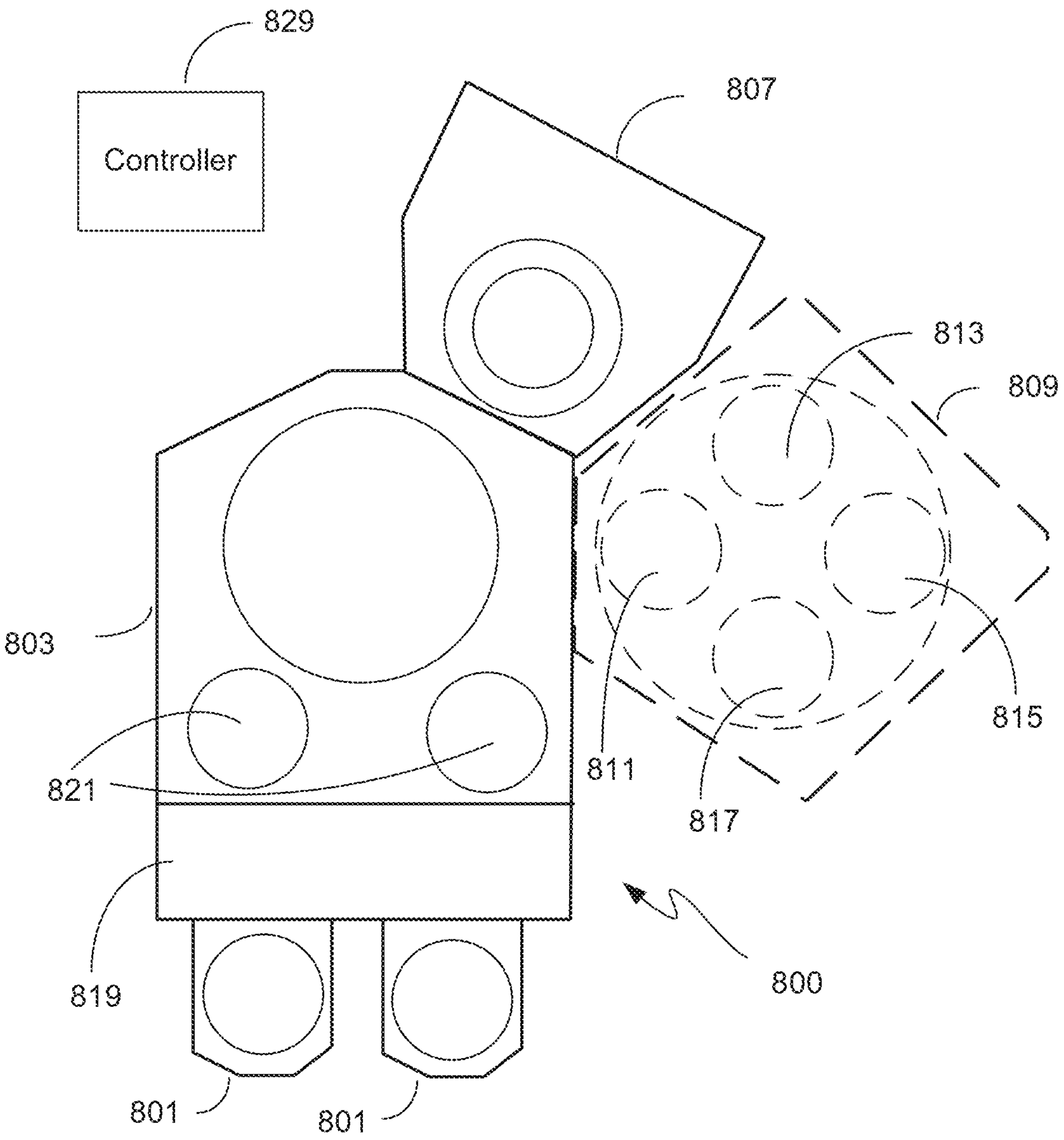
FIG. 8 is a block diagram of a processing system suitable for conducting deposition processes in accordance with embodiments described herein.

FIG. 8 is a block diagram of a processing system suitable for conducting deposition processes in accordance with embodiments described herein. The system 800 includes a transfer module 803. The transfer module 803 provides a clean, pressurized environment to minimize the risk of contamination of substrates being processed as they are moved between the various reactor modules. Mounted on the transfer module 803 is a multi-station reactor 809 capable of performing ALD depositions as described herein. Chamber 809 may include multiple stations 811, 813, 815, and 817 that may sequentially perform these operations. For example, chamber 809 could be configured such that stations 811 and 813 perform nucleation layer deposition, and stations 813 and 815 perform bulk layer deposition. Each deposition station may include a heated wafer pedestal and a showerhead, dispersion plate or other gas inlet.

Also mounted on the transfer module 803 may be one or more single or multi-station modules 807 capable of performing plasma or chemical (non-plasma) pre-cleans. The module may also be used for various other treatments, e.g., reducing agent soaking. The system 800 also includes one or more (in this case two) wafer source modules 801 where wafers are stored before and after processing. An atmospheric robot (not shown) in the atmospheric transfer chamber 819 first removes wafers from the source modules 801 to loadlocks 821. A wafer transfer device (generally a robot arm unit) in the transfer module 1103 moves the wafers from loadlocks 821 to and among the modules mounted on the transfer module 803.

In some embodiments, a high temperature showerhead is employed.

This allows single, rather than dual, plenum showerheads to be used. By maintaining showerhead internal wetted surfaces at greater than 150° C. or 200° C., $NH_3$ and metal oxychloride or metal chloride precursors can be used in a single plenum showerhead without $NH_4Cl$ condensation. Alternately dual-plenum showerheads may be used in which $NH_3$ is delivered through one plenum and metal chloride or oxychloride precursors can be delivered through the other plenum.

As noted above, in some embodiments, depositing both metal (nitride) nucleation and pure metal in a single process chamber facilitates the conversion of the as-deposited metal $+O_x+NH_x+Cl_x$ nucleation film to pure metal by high-temperature reaction with $H_2$, metal (oxychloride), and their byproducts (HCl, $OCl_x$, Metal-$Cl_x$, . . . ). This may be done in a multi-station reactor with low-temperature at the first deposition station and high temperatures at subsequent deposition stations as described above. In some embodiments, the individual deposition stations in a multi-station deposition reactor can be isolated from each other by shaping the showerheads and pedestals such that in a pedestal-up process position, the two assemblies create a small process volume above the wafer and a very narrow gap to isolate the process volume from the main chamber. The narrow gap at the edge of the process volume can be augmented with an inert gas purge barrier to make it difficult for gas to diffuse from the main chamber into the process volume. The narrow gap at the edge of the process volume can also incorporate a local pumping plenum to prevent process gas from entering the main chamber. This can eliminate the risk of deposition or particle generation in the main chamber. The narrow edge gap by itself can eliminate the risk of gas from the main chamber diffusing back into the wafer processing volume such there is no station to station cross talk.

As noted above, in certain embodiments, a system includes two different deposition chambers. For example, referring to FIG. 8, two deposition chambers may be mounted on transfer module 803. In such embodiments, each deposition chamber may be a single or multi-station chamber. Still further, two deposition chambers not under common vacuum may be employed.

In certain embodiments, a system controller 829 is employed to control process conditions during deposition. The controller will typically include one or more memory devices and one or more processors. The processor may include a CPU or computer, analog and/or digital input/output connections, stepper motor controller boards, etc.

The controller may control all of the activities of the deposition apparatus. The system controller executes system control software including sets of instructions for controlling the timing, mixture of gases, chamber pressure, chamber temperature, wafer temperature, radio frequency (RF) power levels if used, wafer chuck or pedestal position, and other parameters of a particular process. Other computer programs stored on memory devices associated with the controller may be employed in some embodiments.

Typically, there will be a user interface associated with the controller. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general-purpose processor. System control software may be coded in any suitable computer readable programming language. Alternatively, the control logic may be hard coded in the controller. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place.

The computer program code for controlling the deposition and other processes in a process sequence can be written in any conventional computer readable programming language: for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, cooling gas pressure, and chamber wall temperature. These parameters are provided to the user in the form of a recipe and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the deposition processes described herein. Examples of programs or sections of programs for this purpose include substrate positioning code, process gas control code, pressure control code, and heater control code.

In some implementations, a controller 829 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 829, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 829, in some implementations, may be a part of or coupled to a computer that is integrated with, coupled to the system, otherwise networked to the system, or a combination thereof. For example, the controller 829 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus, as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a CVD chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller 829 may include various programs. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in pedestal or chuck. Appropriately programmed feedback and control algorithms may be used with data from these sensors to maintain desired process conditions.

The foregoing describes implementation of embodiments of the disclosure in a single or multi-chamber semiconductor processing tool.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically comprises some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

In the description above and in the claims, numerical ranges are inclusive of the end points of the range. For example, "a thickness between 1 and 5 nm" includes 1 nm and 5 nm. Similarly, ranges represented by a dash are inclusive of the end points of the ranges.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

The invention claimed is:

1. A method comprising:

providing a substrate comprising a feature;

depositing a nucleation layer in the feature wherein the nucleation layer is a molybdenum oxynitride layer; and removing nitrogen and oxygen from the nucleation layer.

2. The method of claim 1, wherein a substrate temperature during deposition of the nucleation layer is less than 500° C.

3. The method of claim 1, wherein the substrate is provided to a chamber, and further comprising providing a second substrate to the chamber, the second substrate comprising a partially fabricated 3D NAND structure comprising a plurality of wordline features, the wordline features having aluminum oxide surfaces, and depositing a second nucleation layer in the wordline features of the second substrate.

4. The method of claim 3, wherein the substrate and the second substrate are processed in parallel.

5. The method of claim 1, wherein the nucleation layer is amorphous.

6. The method of claim 1, wherein the substrate comprises a partially fabricated 3D NAND structure and wherein the feature is one of a plurality of wordline features of the 3D NAND structure, the wordline features having aluminum oxide surfaces.

7. The method of claim 1, wherein the feature has an aluminum oxide surface.

8. The method of claim 7, further comprising exposing the aluminum oxide surface to ammonia.

9. The method of claim 1, further comprising depositing an elemental molybdenum layer in the feature.

10. The method of claim 9, wherein a substrate temperature during deposition of the elemental molybdenum layer is higher than the substrate temperature during deposition of the nucleation layer.

11. The method of claim 9, wherein removing nitrogen and oxygen from the nucleation layer comprises flowing hydrogen ($H_2$) to a chamber housing the substrate.

12. The method of claim 1, wherein depositing the nucleation layer comprises exposing the substrate to a molybdenum oxychloride precursor and ammonia.

13. The method of claim 12, wherein exposing the substrate to the molybdenum oxychloride precursor and ammonia comprises sequentially exposing the substrate to the molybdenum oxychloride and ammonia.

14. The method of claim 12, wherein the molybdenum oxychloride precursor is molybdenum dioxide dichloride ($MoO_2Cl_2$) or molybdenum oxytetrachloride ($MoOCl_4$).

* * * * *